(12) United States Patent
Erturk et al.

(10) Patent No.: US 10,483,645 B2
(45) Date of Patent: Nov. 19, 2019

(54) COMBINED LOOP-DIPOLE ANTENNA ARRAY SYSTEM AND METHODS

(71) Applicant: REGENTS OF THE UNIVERSITY OF MINNESOTA, Minneapolis, MN (US)

(72) Inventors: Mehmet Arcan Erturk, Minneapolis, MN (US); Greg Metzger, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 47 days.

(21) Appl. No.: 15/415,241

(22) Filed: Jan. 25, 2017

(65) Prior Publication Data
US 2017/0214138 A1  Jul. 27, 2017

Related U.S. Application Data

(60) Provisional application No. 62/287,288, filed on Jan. 26, 2016.

(51) Int. Cl.
| | |
|---|---|
| *H01Q 7/00* | (2006.01) |
| *H01Q 1/24* | (2006.01) |
| *H01Q 9/06* | (2006.01) |
| *H01Q 21/06* | (2006.01) |
| *H01Q 1/50* | (2006.01) |
| *H01Q 1/22* | (2006.01) |

(52) U.S. Cl.
CPC .............. *H01Q 7/00* (2013.01); *H01Q 1/22* (2013.01); *H01Q 1/24* (2013.01); *H01Q 1/245* (2013.01); *H01Q 1/50* (2013.01); *H01Q 9/06* (2013.01); *H01Q 9/065* (2013.01); *H01Q 21/062* (2013.01)

(58) Field of Classification Search
CPC ........ H01Q 7/00; H01Q 21/062; H01Q 1/245; H01Q 1/50; H01Q 1/24; H01Q 9/065; H01Q 9/06; H01Q 1/22; G01R 33/44
USPC ................................................. 343/866, 742
See application file for complete search history.

(56) References Cited

U.S. PATENT DOCUMENTS

| | | | | |
|---|---|---|---|---|
| 3,521,284 A | * | 7/1970 | Strom ................... | H01Q 21/29 343/702 |
| 2007/0216598 A1 | * | 9/2007 | Fabrega-Sanchez .... | H01Q 9/16 343/866 |

(Continued)

FOREIGN PATENT DOCUMENTS

| | | |
|---|---|---|
| EP | 2669697 A2 | 12/2013 |
| WO | 2013159053 A1 | 10/2013 |
| WO | 2014133391 A1 | 9/2014 |

OTHER PUBLICATIONS

Alexander J.E. Raaijmakers, Dennis W.J. Klomp, Fredy Visser, Hans Hoogduin, Peter R. Luijten, and Cornelis A.T. van den Berg, "Successjul body imaging at Tesla: The Fractionated Dipole Antenna", p. 0314.*

(Continued)

*Primary Examiner* — Hai V Tran
(74) *Attorney, Agent, or Firm* — Quarles & Brady LLP

(57) ABSTRACT

A hybrid antenna array for use in an MRI device, the array comprising a plurality of loop-line elements, each loop line element comprising a loop element and a line element, wherein the loop element and the line element are aligned along their respective center axis and coupled at an input coil port; and wherein the plurality of loop-line elements are configured to operate in a multi-channel array.

26 Claims, 18 Drawing Sheets

(56) References Cited

U.S. PATENT DOCUMENTS

| | | | |
|---|---|---|---|
| 2012/0032678 A1* | 2/2012 | Vaughan, Jr. | G01R 33/3415 324/318 |
| 2015/0137815 A1* | 5/2015 | Lakshmanan | G01R 33/34038 324/322 |

OTHER PUBLICATIONS

Barberi, et al., A Transmit-Only/Receive-Only (TORO) RF System for High-Field MRI/MRS Applications, Magnetic Resonance in Medicine, 2000, 43:284-289.

Chen, et al., A Combined Electric Dipole and Loop Head Coil for 7T Head Imaging, Proc. Intl. Soc. Mag. Reson. Med., 2015, 23:3133.

Edelstein, et al., The Intrinsic Signal-To-Noise Ratio in NMR Imaging, Magnetic Resonance in Medicine, 1986, 3 (4):604-618.

Eryaman, et al., Combined Loop + Dipole Arrays for 7 T Brain Imaging, Proc. Intl. Soc. Mag. Reson. Med., 2013, 21:0393.

Eryaman, et al., SAR Reduction in 7T C-Spine Imaging Using a "Dark Modes" Transmit Array Strategy, Magnetic Resonance in Medicine, 2015, 73:1533-1539.

Raaijmakers, et al., Dipole Antennas for Ultrahigh-Field Body Imaging: A Comparison with Loop Coils, NMR in Biomedicine, 2016, 29(9):1122-1130.

Raaijmakers, et al., The Fractionated Dipole Antenna: A New Antenna for Body Imaging at 7 Tesla, Magnetic Resonance in Medicine, 2016, 75:1366-1374.

Siemens Healthineers, Translate 7T Research Power Into Clinical Care With Magnetom Terra, Copyright Siemens Medical Solutions USA, Inc., 2018, 36 pages.

Snyder, et al., Comparison Between Eight- and Sixteen-Channel TEM Transceive Arrays for Body Imaging at 7 T, Magnetic Resonance in Medicine, 2012, 67:954-964.

Voogt, et al., Combined 8-Channel Transceiver Fractionated Dipole Antenna Array with a 16-Channel Loop Coil Receive Array for Body Imaging at 7 Tesla, Proc. Intl. Soc. Mag. Reson. Med., 2015, 23:0631.

Wiggins, et al., Mixing Loops and Electric Dipole Antennas for Increased Sensitivity at 7 Tesla, Proc. Intl. Soc. Mag. Reson. Med., 2013, 21:2737.

* cited by examiner

COMBINED LOOP-DIPOLE ANTENNA ARRAY SYSTEM AND METHODS

STATEMENT REGARDING FEDERALLY SPONSORED RESEARCH OR DEVELOPMENT

This invention was made government support under P41 EB015894, R01 CA155268 and S10 RR026783 awarded by the National Institutes of Health. The government has certain rights in the invention.

CROSS-REFERENCE TO RELATED APPLICATIONS

This application is related to, and incorporates herein by reference in its entirety, U.S. Application Ser. No. 62/287,288, filed Jan. 26, 2016, and entitled "Combined Loop-Dipole Antenna Array System and Methods."

BACKGROUND

The subject matter disclosed within generally relates to coils for use in Magnetic Resonance Imaging (MRI) systems. MRI systems rely on both magnetic field and RF energy to create images. Generally, as the magnetic field strength increases, the optimum RF frequency increases proportionally. For example, the optimum RF frequency for a magnetic field strength of one Tesla (T) can be about 43 MHz. However, an optimum RF frequency for a magnetic strength of 3T can be about 128 MHz, and an optimum RF frequency for a magnetic strength of 7T can be about 300 MHz.

MRI systems generally require coils that can act as antennas to transmit and receive RF pulses. These coils can be referred to as transceivers due to their ability to both transmit and receive. However, the coils can also operate as receive-only or transmit-only antennas. The RF pulses are used to image a subject in an MRI. In order to further increase the image resolution of surface coil MRI, higher magnetic field strength MRI magnets can be used (3T and 7T). However, with this increased magnetic field strength, high RF frequencies are required. This higher RF frequency requirement can result in challenges related to operating in the ultrahigh field range (UHF, $B_0 \geq 7T$). UHF MRI of the human body is challenging due to the reduced wavelengths in tissue resulting in electro-magnetic (EM) field interferences, causing $B_1^+$ field inhomogeneities, reduced RF penetration and reduced transmit efficiency. Multichannel local transmit coil arrays have been developed to overcome some of the above challenges. For example, loop-coils, microstrip line elements, and dipole antennas.

Use of dipole antennae have become increasingly popular in UHF MRI and in deep tissue targets, as linear (i.e. electric dipole-like) current patterns are recognized as being favorable when considering ultimate signal-to-noise ration (SNR). Several coil arrays have been successfully used in body imaging applications by using different implementations of dipole antenna designs. Current designs rely on element separation to maintain adequate decoupling performance; a requirement that limits the number of elements can improve transmit performance by providing more degrees of freedom for shimming algorithms and can also provide a means to deliver higher peak power in systems using available hardware. This is important in UHF applications where demanding high peak $B_1^+$ acquisitions are needed and/or where deeply situated or large tissue targets are pursued, utilizing the full capabilities of the MR transmit hardware has utmost importance.

In a dipole antenna, the current distribution is symmetric along the long axis, whereas a loop-coil demonstrates an anti-symmetric current distribution. Due to these distinct current distribution patterns, a dipole antenna and a loop element can be decoupled from each other by carefully aligning the two elements along their center longitudinal axes. Combining electric dipoles with loop-coils has been proposed by Eryaman et al in simulation studies to reduce local specific absorption rates (SAR) in 7T head and spine imaging. Head coil arrays consisting of 8 loops and 8 dipoles on receive have been shown to improve the SNR at the central locations of the head compared to loop-only array designs. Previously, a 7T body imaging array with 8 fractioned dipole antenna transceivers along with 16 loop receivers and demonstrated improved SNR inside the prostate when both dipole and loop element were used on reception. However, dipole and loop-coil elements have not been combined to operate as transceivers (i.e. simultaneously transmit and receive).

Thus, it would be advantageous to have a method and apparatus that allows for hybrid dipole, loop-coil transceivers to improve SNR, $B_1^+$ transmit and SAR efficiencies in order to alleviate the $B_1$ related challenges, particularly, those encountered at higher field strengths, such as 3T, 7T and above. However, the hybrid dipole, loop-coil transceivers discussed herein can also be used to improve SNR, $B_1^+$ transmit and SAR efficiencies in MRI systems operating at any field strength, including those less than 3T.

BRIEF SUMMARY

In one aspect of the disclosure, a hybrid antenna array for use in an MRI device is described. The array comprising a plurality of loop-line elements, each loop line element comprising a loop element and a line element, wherein the loop element and the line element are aligned along their respective center axis and coupled at an input coil port; and wherein the plurality of loop-line elements are configured to operate in a multi-channel array.

In another aspect of the disclosure, a hybrid antenna is described herein. In one implementation, the hybrid transceiver antenna comprises: a loop-coil element, the loop-coil element having a plurality of tuning capacitors in series with the loop-coil element; a dipole antenna element; and wherein the loop-coil element and the dipole antenna element coupled at an input coil port.

BRIEF DESCRIPTION OF THE SEVERAL VIEWS OF THE DRAWINGS

The invention will hereafter be described with reference to the accompanying drawings, wherein like reference numerals denote like elements, and:

FIG. 1a is a layout view of a hybrid loop-coil/dipole antenna transceiver.

FIG. 1d is a physical implementation of the hybrid loop-coil/dipole antenna transceiver in FIG. 1a.

FIG. 13 is a side view of the single TEM-loop block described in FIG. 2a.

FIG. 14 is a top schematic view of the single TEM-loop block described in FIG. 2a.

DETAILED DESCRIPTION

Figure 1B:
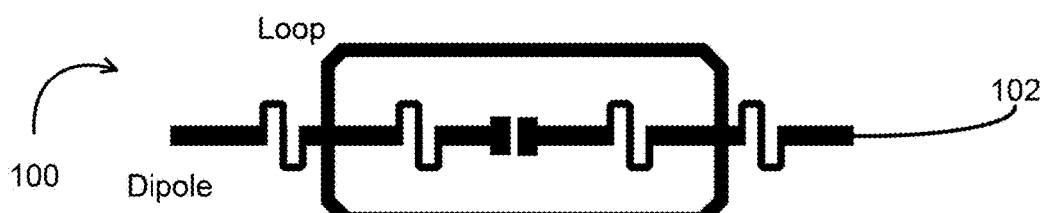
FIG. 1b is a schematic view of a hybrid loop-coil/dipole antenna transceiver.
Figure 1B:
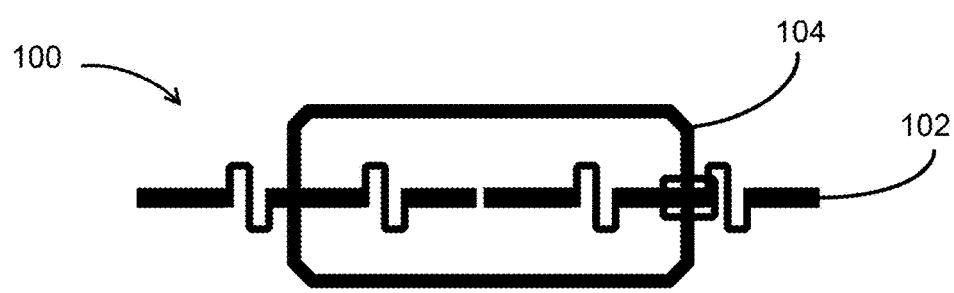
Figure 1B:
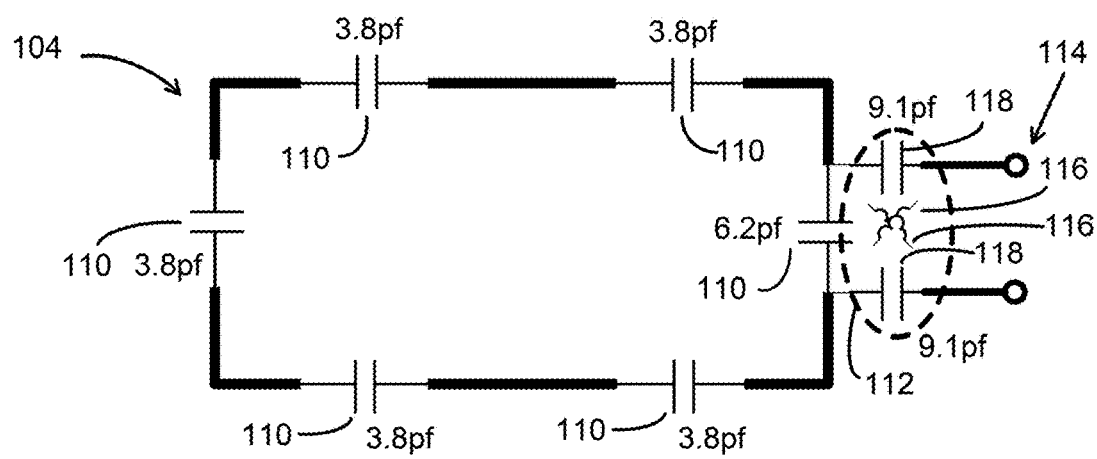
Figure 1B:
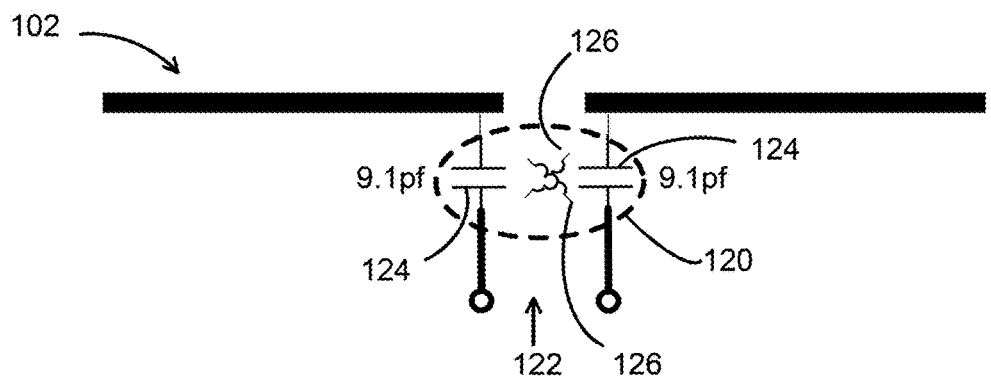

The present disclosure is now provided with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

While the below disclosure is primarily directed to MRI type systems, it should be known that the below described technology is not limited to use in MRI or other medical imaging technologies.

While the embodiments described below refer to hybrid "transceiver" elements and arrays, the term "transceiver" should be understood to mean a coil operable as a transceiver (i.e. able to both transmit and receive), a receiver (i.e. receive only) or a transmitter (i.e. transmit only).

Turning now to FIG. 1a, a loop-coil/dipole antenna block 100 can be seen. In one implementation, the loop-coil/dipole antenna block 100 can be a transceiver. However, the loop-coil/dipole antenna block 100 can also be used as transmit only and/or receive only. The loop-coil/dipole antenna block 100 can include a dipole antenna 102 and a loop-coil 104. The dipole antenna 102 can be a fractionated dipole antenna design, such as that designed by Raaijmakers et al. Further, the fractionated dipole antenna 102 can have the rectangular loop-coil 104 symmetrically placed around the dipole for body imaging at 7T. In one example the size of the loop can be approximately 8 cm by 18 cm, with 6 mm wide conductors (e.g., copper traces that are 6 mm thick). Further, the loop can be of a rectangular, circular or elliptical shape. The loop conductors can be broken at multiple locations for the placement of distributed tuning capacitors. As shown in FIG. 1a, the loop conductor is broken in six locations. For example, fixed value, non-magnetic ceramic chip capacitors can be used to tune and match the dipole antenna 102 and the loop-coil 104.

In one implementation, the dipole antenna 102 and the loop-coil can be 104 can be etched on separate 1.35 mm thick FR4 printed circuit boards. For example, separate circuit boards can be used to implement line and loop elements. In different implementations, the same circuit board may be used to implement both line and loop elements (e.g., using a double-sided circuit board). That is, a single physical structure may contain a line element and a loop element. As resonant structures, a line and a loop element can be two (or more) separate circuit boards (one or more for line, and one or more for loop), or they could be printed on the same physical circuit board. Similarly, a line and multiple loop elements and/or multiple line and multiple loop elements can, in various implementations, be realized using the same physical circuit board.

The loop-coil/dipole antenna block 100 offers advantages over standard dipole antenna arrays, which rely on physical separation between neighboring elements to minimize coupling. This dipole only arrangement can limit the number of elements that can be placed around a body without diminishing the decoupling performance. The hybrid array discussed above, having the combined loop-coil 104 and dipole antenna 102 elements can increase the element density and channel count without compromising the decoupling achieved by maintaining the distance between adjacent elements. Further, the combination of loop-coils 104 and dipole antenna 102 elements can utilize the inherent transmit and receive characteristics of both the loop-coil 102 and the dipole antenna 102. For example, the loop-coil 104 elements generally have better transmit and receive performance at shallower depths than a dipole antenna 102. In contrast, dipole antennae 102 elements can have improved transmit and receive performance characteristics at greater depths when compared to conventional loop-coils 104 or microstrip line elements. This differentiation can be greater in high magnetic field environments, such as 7T imaging. Thus, the combined loop-coil 104 and dipole antenna 102 array described herein can allow the advantages of each individual element to be utilized to increase overall performance not only on receive, but also on transmit. Additionally, by using the loop-coil/dipole antenna block 100 above in a transmit or receive-only mode, can allow for better operation at lower field strength MRI systems, such as 1.5T and 3T.

Further advantages include increased element density and channel count in an array can be achieved while maintaining good decoupling performance between channels using a loop-coil/dipole antenna block. Additionally, loop-coil/dipole antenna blocks can allow for spatial steering of the electromagnetic field by adjusting the relative excitation phase and amplitude of loop and dipole elements.

FIG. 1b shows a detailed schematic view of the loop-coil/dipole antenna block 100 of FIG. 1a. Loop-coil 104 can be seen to have six tuning capacitors 110, and a lattice balun 112 at a coil input port 114. In some configurations, other types of baluns can be used. Further, in other examples, no balun is necessary. In one configuration, the tuning capacitors 110 can have a value of 3.8 pF. Additionally, the tuning capacitor 110 at the coil input port 114 can have a separate value to properly match the input. For example, the tuning capacitor 110 at the coil input port 114 can have a value of 6.2 pF. However, the tuning capacitors 110 can have values as needed to properly tune the loop-coil 104. Additionally, in some configurations, the tuning capacitors can be variable capacitors. Further, the lattice balun 112 can be comprised of two inductors 116 and two capacitors 118. In some configurations, the lattice balun 112 can be comprised of more or fewer elements, as needed. In one example, the capacitors 118 can have a value of 9.1 pF and the inductors 116 can have a value of 20 nH. However, the capacitors 118 and inductors 116 can have other values, as applicable. Further, while the elements are shown to be matched, in some applications it may be desirable to use unmatched components to obtain proper tuning. Further, transmit/receive switches and preamplifiers can also be incorporated into the loop-coil/dipole antenna block 100.

FIG. 1b further shows the dipole antenna 102 in more detail. In one configuration, the dipole antenna 102 can have a lattice balun 120, at a coil input port 122. The lattice balun can be comprised of two capacitors 124 and two inductors 126. In one example, the lattice balun 120 of the dipole antenna can be the same as the loop-coil 104 lattice balun 112. However, in some examples, the dipole antenna 102 and the loop-coil 104 can have separate lattice baluns. The above values for various components of the loop-coil/dipole antenna 100 are for one exemplary configuration. The above values can depend on multiple variables, including size of coils, loading conditions, and materials used.

The $B_1^+$ transmit efficiency metric relates to the $B_1^+$ levels that can be achieved at a target location, which can have great implications on a successful implementation of a pulse sequence. If the desired $B_1^+$ cannot be achieved, poor image quality and/or altered image contrast can result. Additionally, the $B_1^+$ SAR efficiency metric can have direct implications on the scan duration of a particular pulse sequence which is constrained by power deposition limits. For example, a loop-coil with a higher $B_1^+$ SAR efficiency can reduce or remove restrictions on sequence timing, and/or shorten scan durations.

In one example, combining dipole antenna 102 and loop-coil 104 elements in an UHF imaging array by simultaneously receiving the magnetic resonance (MR) signal from multiple structures can improve the SNR in head and prostate imaging. In a simulation study, Eryaman et al. demonstrated that the addition of dipole elements in the so-called "dark-mode" could reduce the local SAR of a loop array for spine imaging. However, the $B_1^+$ excitation and SAR performance of a combined dipole-loop array had not been experimentally investigated as a means to address the major challenges facing body imaging application at UHF ranges.

In one configuration of hybrid array 100, the loop-coils 104 have widths of 8 cm, which can provide adequate circumferential coverage around a body using 8 blocks, while simultaneously maintaining sufficient decoupling between neighboring loop elements without the need for additional decoupling strategies. In larger subjects, individual LD (loop-dipole) blocks could be placed further apart from each other in order to reduce the amount of coupling between neighboring elements, and/or more blocks can be included. A fabric housing can be used to maintain a similar loading condition between different subjects by helping to keep the elements in close contact to the body across their length when imaging the various anatomical targets. Additionally, inter-subject loading variations did not result in significant tuning and matching variations on the subjects, even when the elements of the hybrid array 100 were tuned and matched using fixed value lumped elements. This limited tuning and matching variation across various subjects can reduce the expense of increased preparation time and design complexity. However, subject dependent manual tuning and matching may still improve the performance of the array. Furthermore, if the loop-coil/dipole antenna blocks cannot lay flat against the surface of the body along a significant portion of their length due to certain body geometries, loading variations can result in shifts in the tuning frequency and can thereby reduce coil performance. Automated tuning and matching approaches can help to achieve optimum array performance on different subjects without extending the preparation time prior to imaging.

While imaging acquisitions were not specifically optimized for use with this coil and available SNR, the in vivo studies of the prostate, kidneys and heart described below demonstrate the potential of the hybrid array 100 to obtain high quality data even when imaging larger anatomic targets. The improved SNR of the hybrid array 100 can enable in-plane voxel-sizes of 0.5×0.5 mm² inside the prostate of all subjects with acceptable SNR, approaching the resolutions obtained at 3T using external surface arrays combined with endo-rectal coils. The kidney images show the ability to provide high SNR in the periphery and in the descending aorta positioned at the center of the body with relatively even contrast through the axial and coronal cross-sections. The cardiac scans demonstrate excellent contrast and SNR at the posterior of the heart in all three main views using a single RF shim solution optimized for homogeneity. In these acquisitions phase-only static $B_1^+$ shimming provided adequate field homogeneity and transmit efficiency, however use of parallel transmission RF pulses and RF optimized excitation schemes could further improve the excitation homogeneity and image quality which will be investigated in future studies. These experimental results are discussed below.

In one configuration, a 16-channel loop-coil/dipole antenna array is constructed using eight individual and identical loop-coil/dipole antenna blocks 100 as described above. The individual loop-coil/dipole antenna blocks 100 were arranged to provide four anterior loop-coil/dipole antenna blocks and four posterior loop-coil/dipole antenna blocks. Two housings were constructed of vinyl fabric. Each housing contained the four loop-coil/dipole antenna blocks for both the anterior and posterior groups. The housing were constructed to be flexible to allow for the loop-coil/dipole antenna blocks to conform to subjects with differing body sizes and shapes, as well as at different locations on the body. Allowing for the loop-coil/dipole antenna arrays to conform to the body allows for performance to be maintained by providing designed loading conditions for a fixedly tuned and matched coil. Within each housing, a constant separation of 3.5 cm between the edges of adjacent loop-coil/dipole antenna blocks was maintained with a center to center distance of approximately 11.5 cm. Further, power splitters can be incorporated into the loop-coil/dipole antenna blocks to allow multiple channels to be driven using one power amplifier.

Figure 1C:
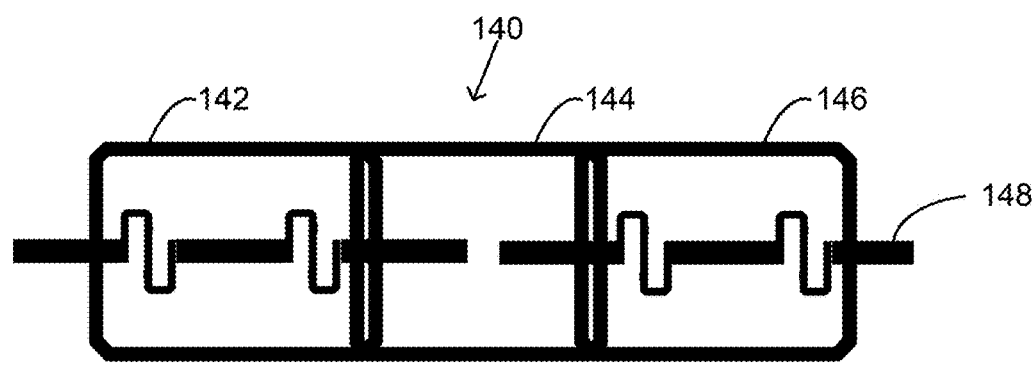
FIG. 1c is a schematic view of hybrid multi-loop-coil/dipole antenna transceiver.
Figure 1C:
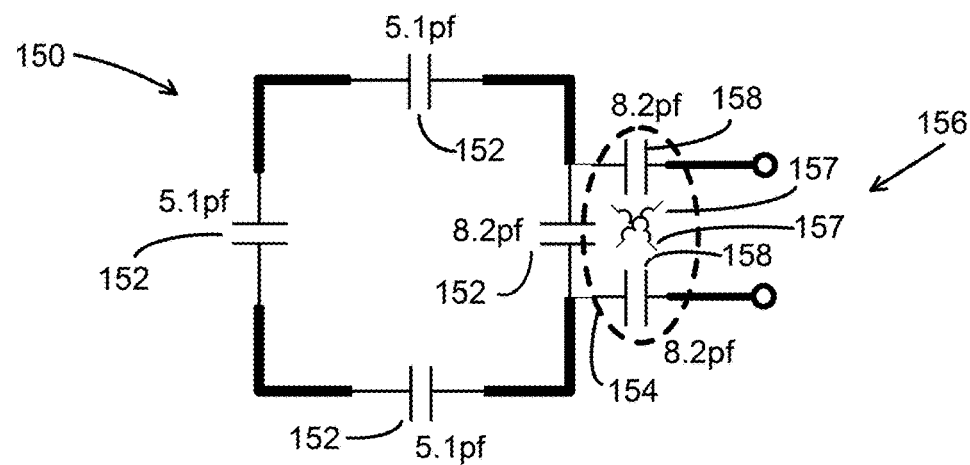
Figure 1C:
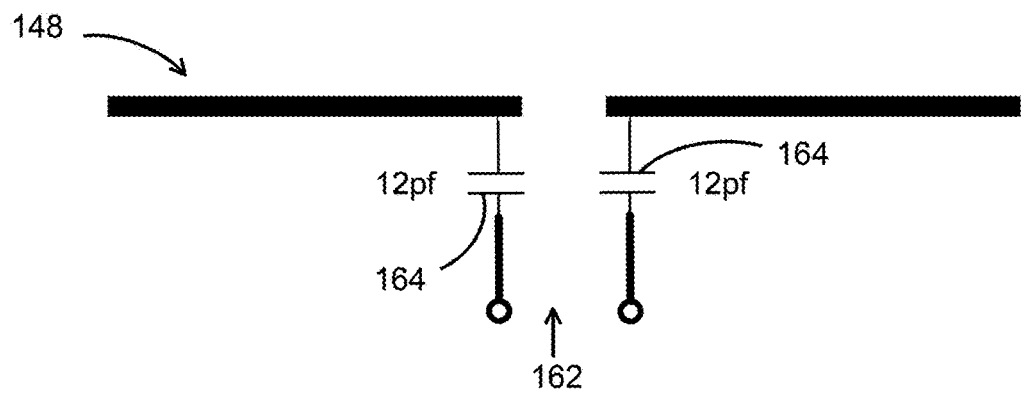
Figure 1D:
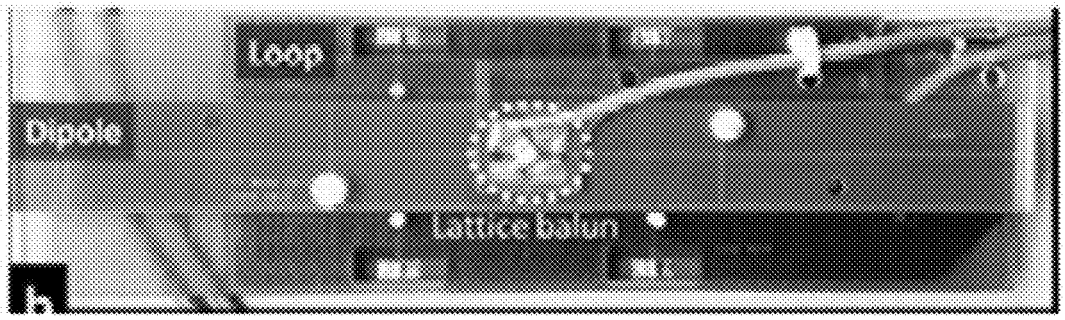

In a further configuration, a 32-channel loop-coil/dipole antenna array can be constructed. The 32-channel loop-coil/dipole antenna array can consist of eight individual loop-coil/dipole antenna blocks. Turning now to FIG. 1c a multi loop-coil/dipole antenna block 140 is shown. The block 140 can include three loop-coils 142, 144, 146 surrounding a dipole antenna 148. In one example the size of each loop-coil 142, 144, 146 can be approximately 6 cm by 9 cm, with a 15 mm overlap between the loop coils, and with 6 mm wide conductors (e.g., copper traces that are 6 mm thick). The three loop-coils 142, 144, 146 can be combined into a mathematical representative loop-coil 150. Loop-coil 150 can be seen to have four tuning capacitors 152, and a lattice balun 154 at a coil input port 156. Similar to above, some configurations may use other types of baluns at the coil input port 156, or no balun at all. In one configuration, the tuning capacitors 152 can have a value of 5.1 pF. However, the tuning capacitors 152 can have values as need to properly tune the loop-coil 150. Additionally, the tuning capacitors 152 can be variable capacitors. Further, the lattice balun 154 can be comprised of two inductors 157 and two capacitors 158. In some configurations, the lattice balun 154 can be comprised of more or fewer elements, as needed. In one example, the capacitors 158 can have a value of 9.1 pF and the inductors 157 can have a value of 20 nH. However, the capacitors and inductors can have other values, as applicable. Further, while the elements are shown to be matched, in some applications it may be desirable to use unmatched components to obtain proper tuning.

FIG. 1c further shows the dipole antenna 148 in more detail. In one example, the length of the dipole antenna 148 may be 30 cm, with 10 mm wide conductors (e.g., copper traces that are 10 mm thick). In one configuration, the dipole antenna 148 can include two matching capacitors 164 which can be used to match the dipole antenna 148 to the proper input impedance. In one example, the matching capacitors 164 can have a value of 12 pF. However, other values can be used to as needed to properly tune and match the dipole antenna 148 to the coil input port 162. In other configurations, the dipole antenna 148 can have a lattice balun between the dipole antenna 148 and the coil input port 162. The above values for various components of the loop-coil/dipole antenna 140 are for various exemplary configurations. The above values can depend on multiple variables, including size of the coils, loading conditions, and materials used.

Figure 2A:
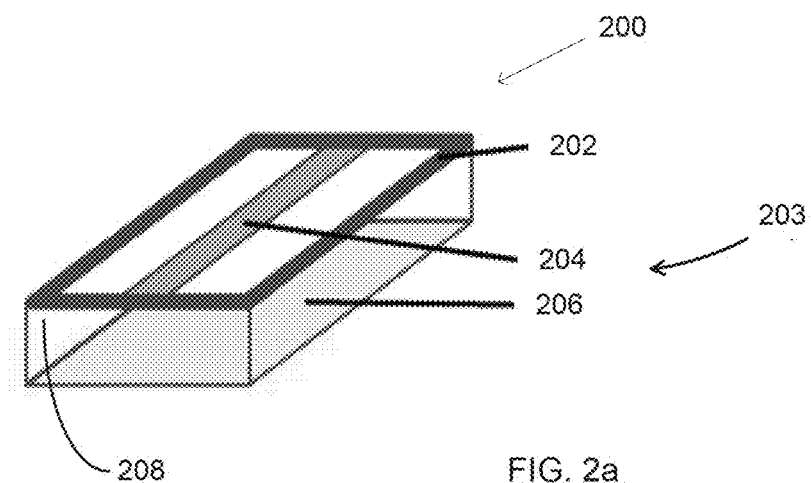
FIG. 2a is a schematic view of a single loop TEM-loop transceiver.
Figure 2B:
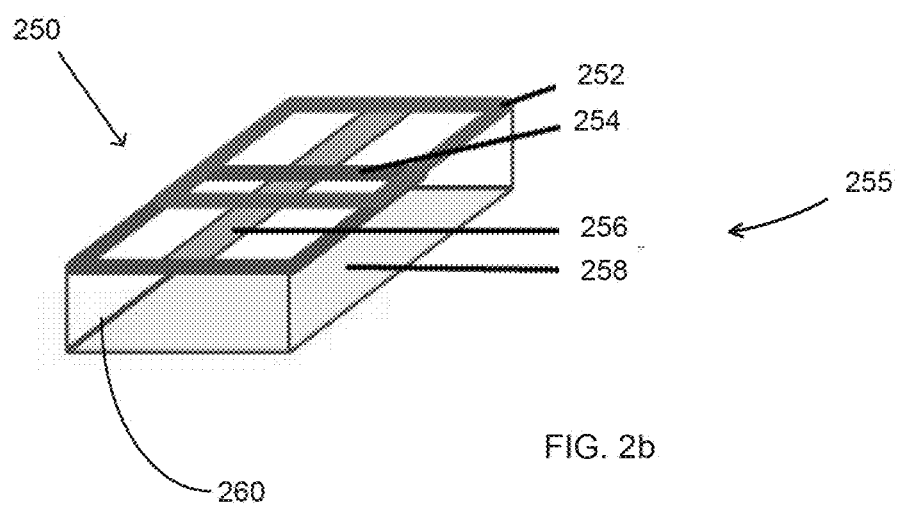
FIG. 2b is a schematic view of a multi-loop TEM-loop transceiver.
Figure 3A:
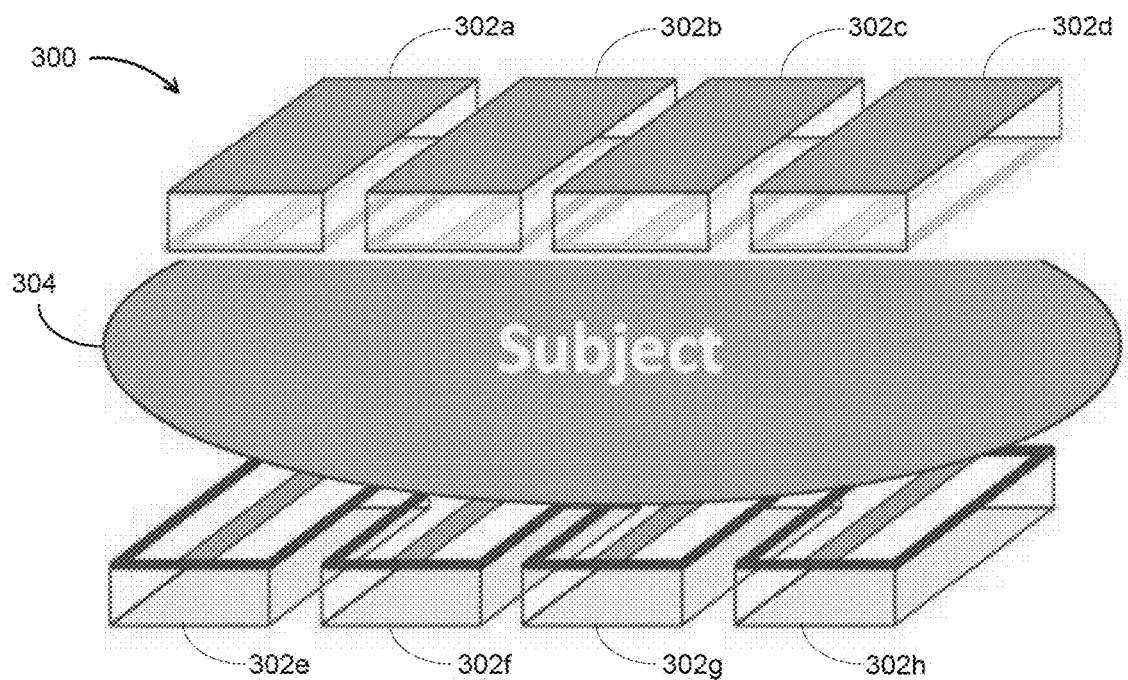
FIG. 3a is a system view of 16-channel TEM-loop transceiver array.
Figure 3B:
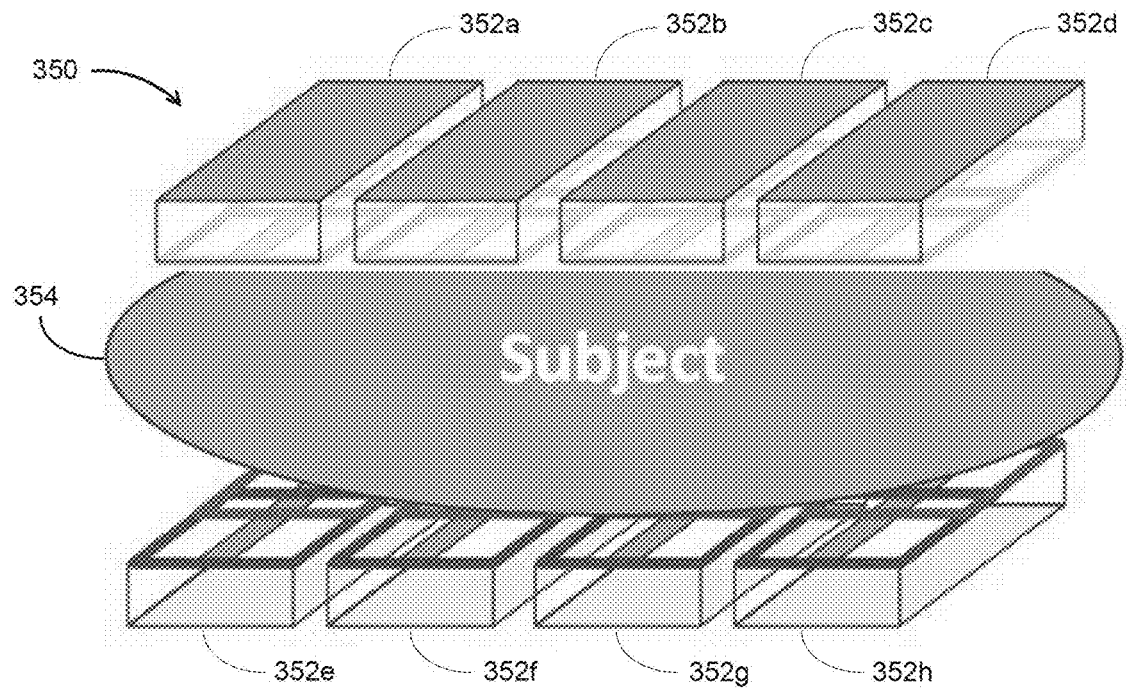
FIG. 3b is a system view of a 24-channel TEM-loop transceiver array.

In some configurations, the dipole antennae can be replaced with microstrip line (TEM) elements. Similar decoupling performance can be attained when using TEM-loop element combination. TEM-loop combinations can be beneficial in lower magnetic strength systems, such as 3T. FIG. 2a shows a single TEM-loop block 200. The TEM-loop block 200 can include a loop-coil element 202, and a TEM element 203. The TEM element can include a top conductor 204, a bottom conductor 206 and a substrate 208. The substrate 208 can be positioned between the top conductor 204 and the bottom conductor 206. FIG. 2b shows a multi TEM-loop block 250 having a first loop-coil element 252 and a second loop-coil element 254. The TEM-loop block further includes a TEM element 255. The TEM element 255 can include a top conductor 256, a bottom conductor 258 and a substrate 260. The substrate 260 can be positioned between the top conductor 256 and the bottom conductor 258. Turning to FIG. 3a, a 16-channel TEM-loop-coil array 300 can be seen. The 16-channel TEM-loop-coil array includes eight TEM-loop blocks 302a-h, four on each side of a subject 304. FIG. 3b shows a 24-channel TEM-loop-coil array 350. The 32-channel TEM-loop-coil array includes eight multi-loop TEM-loop blocks 352a-h, four on each side of a subject 354.

The hybrid transceiver blocks discussed above can be used as building blocks to develop transceiver arrays which can be used in MRI devices to improve SNR, $B_1^+$ transmit characteristics and SAR performance compared to previously existing devices. Example hybrid transceiver blocks can include the loop-coil/dipole antenna block 100; the multi loop-coil/dipole antenna block 140; the single TEM-loop block 200; and the multi TEM-loop block 250 described above. However, other configurations of the hybrid transceiver components discussed above can also be used as building blocks.

In still further configurations, the use of multi-channel coils described above can be used in conjunction with an MRI system having a lower number of amplifiers. For example, high channel count coil arrays (n-channel) may be used on MRI systems with a lower number of amplifiers (k-amplifiers) using the following approaches where k<n. In a first example, a passive power divider can be implemented on each building block (i.e. loop-dipole or TEM-loop) to distribute the incoming power to the channels on the block. Phase and relative amplitudes on each channel inside the same block can be pre-determined. In a second example, power dividers can be placed at the output of power amplifiers to increase the number of channels from k to n. Then, n outputs from the power dividers can be fed into a phase and gain controller (PGC) and PGC outputs can then be connected to an n-channel coil.

Single Loop-Coil/Dipole Antenna Block Test

Figure 1E:
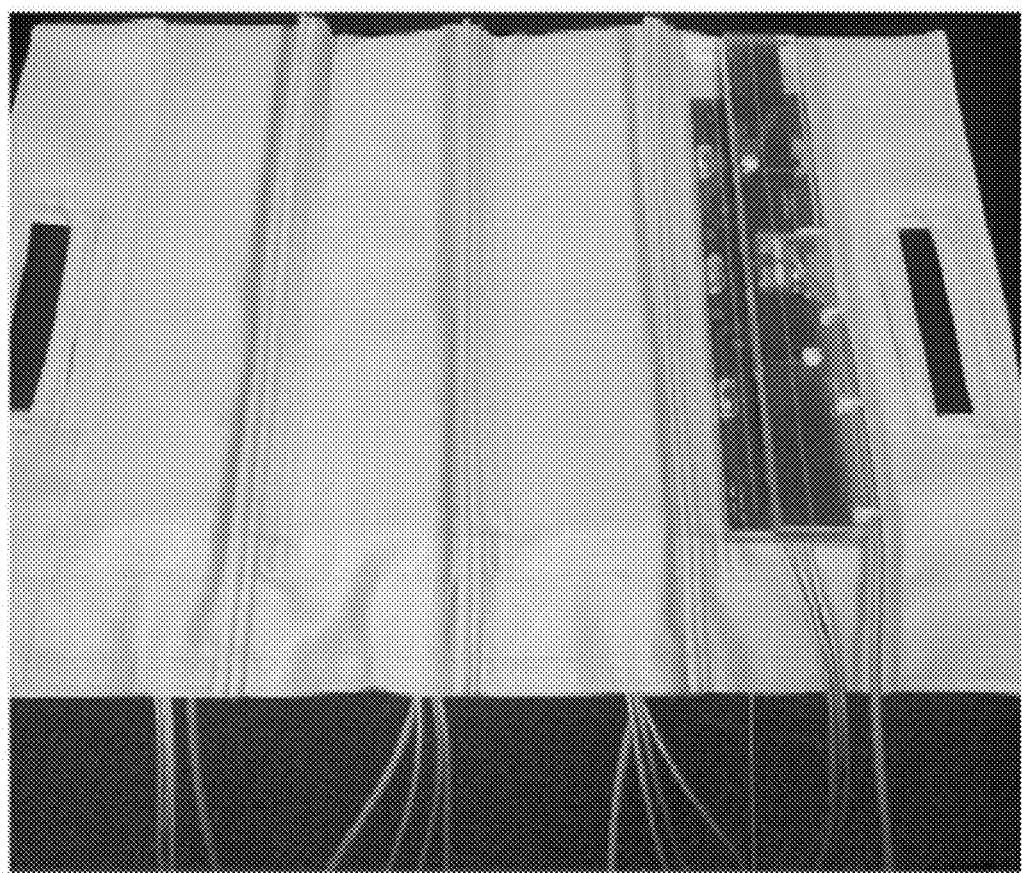
FIG. 1e is a photograph illustrating a fabric housing for a plurality of hybrid loop-coil/dipole antenna transceivers.

FIG. 1e shows an image of one of the loop-coil/dipole antenna blocks 100 used in the following experiments. The hybrid transceiver 100 used in the following experiments use an 8-by-18 cm loop-coil 104 with 6 mm wide conductors. The loop-coil 104 conductors were broken at six locations for the placement of distributed tuning capacitors. The dipole antenna 102 and loop-coil 104 elements were etched on separate 1.35 mm thick FR4 printed circuit boards, and fixed value non-magnetic ceramic chip capacitors were then used to tune and match the elements. Both elements were provided signals using a plurality of lattice balun networks 112, 120. The lattice balun networks 112, 120 can be used to reduce common mode currents and cable interactions.

Further, the loop-coil 104 was mounted between 3.18 mm and 6.35 mm thick thermoplastic polyetherimide blocks. Example thermoplastic polyetherimide blocks can be ULTEM® 1000 resin, from Sabic Global of Pittsfield, Mass. The dipole antenna 102 was then mounted on top of the 6.35 mm thick block on the opposite side from the load. The loop-coil 104 and dipole antenna 102 were aligned and centered along their long axes. Precise relative placement of the two elements can be critical in achieving acceptable decoupling performance within a single block. In some configurations, exact alignment may be required for proper decoupling. However, in other configurations, slight variations in the alignment can be used to achieve the required decoupling between the loop-coil 104 and the dipole antenna 102.

The single loop-coil/dipole antenna block described above was first investigated using SEMCAD X software from Schmid & Partner Engineering AG, Zurich, Switzerland. A geometrically and electrically correct model of the block was created and placed 1 cm away from the surface of a 30×20×40 cm³ rectangular phantom with a relative permittivity of $\varepsilon_r=34$ and electrical conductivity $\sigma=0.4$ S/m, which represent the average human tissue properties at 300 MHz. The conductors of the elements inside the block were then meshed at ≥2 mm. Both elements were driven with 50Ω voltage sources where the reflection parameters at the ports ($S_{11}$) were matched to better than −15 dB at 297.2 MHz. EM-field distributions were calculated using the finite-difference time-domain (FDTD) solver in the SEMCAD software and exported into Matlab (Mathworks, Inc., Natick, Mass.) for analysis. Peak voxel-wise SAR per unit power ($SAR_{peak}/P$), $B_1^+$ transmit efficiency ($B_1^+/\sqrt{P}$) and $B_1^+$ SAR efficiency ($B_1^+/\sqrt{SAR_{peak}}$) were calculated for the dipole-only, loop-only and dipole-loop combined. $B_1^+$ distributions were averaged inside 8 cm³ cubes centered at 2, 4, 6 and 8 cm depths inside the phantom aligned with the center of the loop-coil/dipole antenna block. The combined simulations were computed for a variety of relative phase settings between the loop-coil/dipole antenna block elements by adding the EM-field distributions of each element at equal forward input power at different phase shifts (range: 1-360°, 1° increments). Furthermore, SAR and $B_1^+$ distributions of the combination with loop power attenuated with respect to the dipole power by 0 to 10 dB in 0.5 dB increments were calculated at a constant relative phase difference determined by $B_1^+$ shimming for efficiency at a depth 6 cm inside the phantom.

Figure 4:
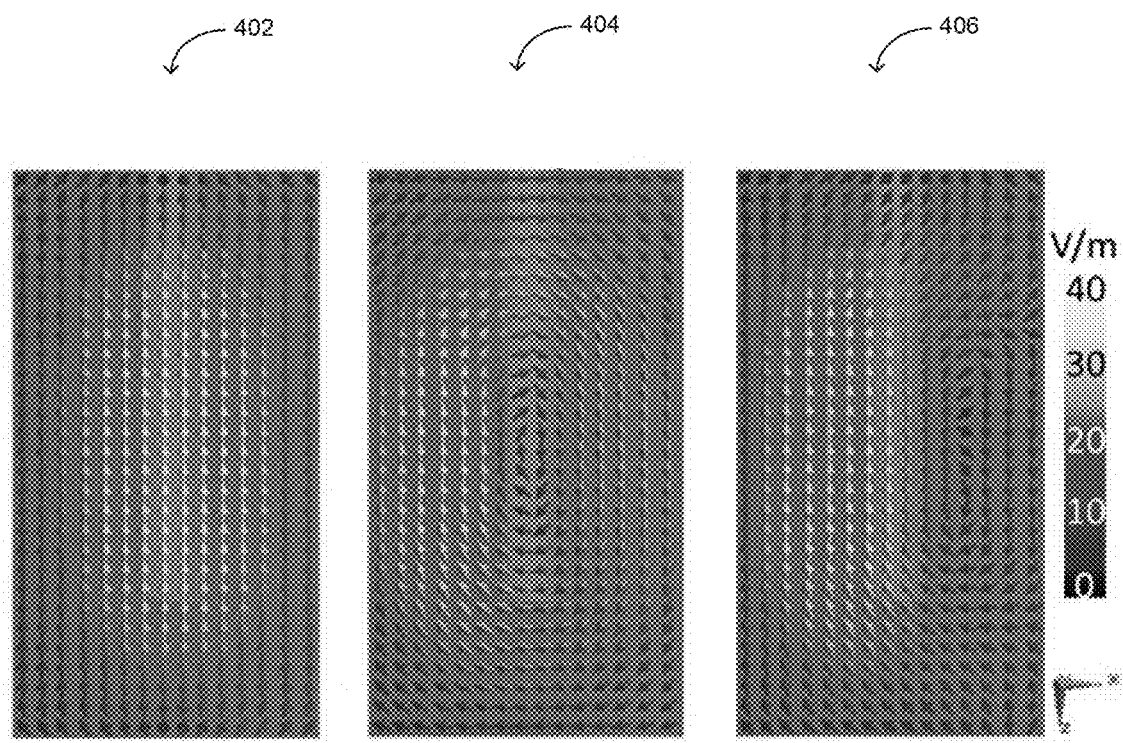
FIG. 4 is a numerically computed E-field distribution of a coronal slice inside a phantom subject.
Figure 5:
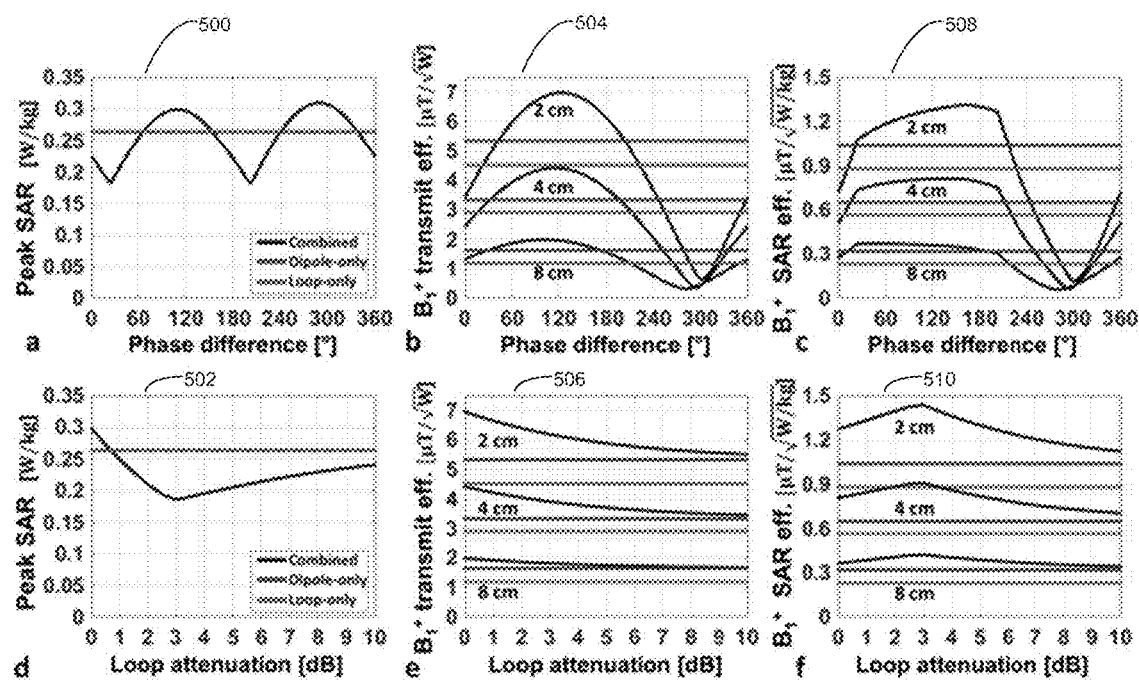
FIG. 5 is an output data series for a loop-coil/dipole antenna simulation for dipole-only, loop-only and loop-coil/dipole antenna transceivers.

Numerically computed magnitude and vector distributions of the E-fields for a dipole-only (402), a loop-coil only (404), and loop-coil/dipole antenna block combined (406) excitations on a coronal slice at a depth of 2 cm inside the block are shown in FIG. 4. The SAR is proportional to the magnitude of the E-field squared. The directions of the dipole-only E-field vectors were uniform across the coronal slice, however the loop-only E-fields had a rotational symmetry. The E-field distribution of the dipole-only excitation was highest underneath the feed point of the antenna between the poles, whereas that same location had zero E-field for the loop-only simulation. Meanwhile, the E-field distributions of the loop-only excitation were highest underneath the mid-point of the long-axis of the loop conductors. The E-field hotspot of the combined excitation shifted along the −x direction where the fields from the two simulations constructively interfere. The magnitude and location of the SAR hot-spot can change when changing the relative transmit phases of the two elements. FIG. 5 shows the peak voxel-wise SAR 500, 502, the $B_1^+$ transmit efficiency 504, 506 and the $B_1^+$ SAR efficiency 508, 510 for the dipole-only, loop-only and loop-coil/dipole antenna block, when both elements are driven at the same power and when the relative phase between the two elements in the block are varied. Coincidentally, peak voxel-wise SAR of the loop and dipole elements were identical. Depending on the phase difference between the dipole and loop elements, the combined excitation yielded from a −31% to +17% peak SAR per unit power compared to dipole-only and loop-only excitations. Using the loop and dipole in combination with an efficiency $B_1^+$ shim, a transmit efficiency gain of 26% and 62% was realized over the dipole-only and loop-only, respectively, at the expense of a 13% increase in peak SAR. Since the $B_1^+$ transmit efficiency gain was higher than the increase in SAR, the SAR efficiency of the combined excitation increased by 21% and 55% compared to dipole-only and loop-only excitations, respectively. This evaluation was performed by averaging over the 8 cm³ regions inside the phantom model.

Peak SAR, $B_1^+$ 502, transmit efficiency 506, and $B_1^+$ SAR efficiency 508 for the dipole-only, loop-only and loop-coil/dipole antenna block simulations are illustrated in FIG. 5. The combined simulations provided up to a 30% reduction in peak SAR resulting in up to 35% and 73% higher $B_1^+$ SAR efficiency compared to dipole-only and loop-only excitations, respectively. The highest $B_1^+$ transmit efficiency was achieved when the dipole and loop excitation power levels were the same (i.e. 'phase-only' shimming), and the highest $B_1^+$ SAR efficiency was achieved when the loop excitation was 3 dB lower than the dipole excitation.

16-Channel Loop-Coil/Dipole Antenna Array Test

A 16-channel loop-coil/dipole antenna array was assembled using eight individual loop-coil/dipole antenna blocks as described above. The individual loop-coil/dipole antenna blocks were arranged to provide four anterior loop-coil/dipole antenna blocks and four posterior loop-coil/dipole antenna blocks. Two housings were constructed of vinyl fabric. Each housing contained the four loop-coil/dipole antenna blocks for both the anterior and posterior groups. The housing were constructed to be flexible to allow for the loop-coil/dipole antenna blocks to conform to subjects with differing body sizes and shapes, as well as at different locations on the body. Allowing for the loop-coil/dipole antenna arrays to conform to the body allows for performance to be maintained by providing designed loading conditions for a fixedly tuned and matched coil. Additionally, an example housing 150 can be seen in FIG. 1e. Within each housing, a constant separation of 3.5 cm between the edges of adjacent loop-coil/dipole antenna blocks was maintained with a center to center distance of approximately 11.5 cm.

Numerical Analysis of the 16-Channel Loop-Coil/Dipole Antenna Array-Pelvis

For prostate simulations, the 16-Channel Loop-coil/Dipole Antenna Array was modeled around the pelvis by placing four loop-coil/dipole antenna blocks on the anterior and four on the posterior side of an anatomically correct human model (Duke from Virtual Family). The blocks were placed 1 cm off the surface of the skin and centered on the prostate along the z-dimension. All the elements were terminated using 50Ω voltage source ports and were tuned and matched to at least an $S_{11}$ of −15 dB at 297.2 MHz. The gradient shield and whole body of the Duke model were included in the simulations. EM-field distributions of each coil element (8 loop-coil, 8 dipole antennae) were computed with an FDTD solver in SEMCAD using variable meshing resolutions (1 mm for all conductors and ≤2 mm for all tissues) and were imported to Matlab for analysis.

In order to evaluate the full performance of the 16-Channel Loop-coil/Dipole Antenna Array, both amplitude and phase shimming was explored with the goal of maximizing $B_1^+$ transmit efficiency ($B_1^+/\sqrt{P_{coil}}$) and $B_1^+$ SAR efficiency ($B_1^+/\sqrt{SAR_{peak10g}}$) inside the prostate. Peak 10 g-averaged SAR, $B_1^+$ transmit efficiency inside the prostate normalized to unit total coil power and $B_1^+$ SAR efficiency normalized to peak 10 g SAR were computed by first re-gridding the EM-field distributions onto a 2 mm uniform grid using nearest-neighbor interpolation and then using the 10 g-averaged SAR Q-matrices formed with a modified version of the N-gram averaging algorithm provided by Carluccio et al. Virtual observation points (VOP) were determined using the 10 g averaged SAR Q-matrix in order to accelerate the shim-dependent peak local SAR calculations.

In contrast to the above simulations which investigated all combination of phase and amplitude shimming, simulations to mimic experimental studies in the prostate were performed with phase-only shimming. In order to explore the tradeoffs in $B_1^+$ and SAR performance of the different resonance structures even without amplitude shimming, relative power levels between the dipole and loop elements were simulated. While the relative power used to drive the different elements do not impact phase-based efficiency shimming, they do affect the quantitative performance metrics including peak 10 g SAR, $B_1^+$ transmit efficiency and peak $B_1^+$ inside the prostate. Specifically, the loops were simulated with equal power, no power at all and with attenuations levels from 1 to 10 dB in 1 dB increments with respect to the dipoles. The time averaged power (TAP) limits yielding 20 W/kg peak local 10 g averaged SAR were determined from these 13 excitation scenarios and were used to ensure RF safety in compliance with IEC guidelines when performing in vivo prostate studies. Peak $B_1^+$ was calculated taking into account the specific hardware configuration at the study site including the number of transmit channels, maximum available power from the power amplifiers, and cable and hardware losses up to the coil.

Receive performance of the 16-Channel Loop-coil/Dipole Antenna Array was investigated by calculating the SNR and geometry factor (g-factor) maps from simulation. SNR inside the prostate was computed by taking the normalized magnitude summation of the $B_1^-$ of individual coil elements $$SNR \sim \left( \frac{\sum_{n=1}^{16} |B_{1,n}^-|}{\sqrt{P_{coil}}} \right).$$

G-factor maps for accelerations of 1-6 in left-right (L-R) and 1-2 in anterior-posterior (A-P) directions were calculated using Musaik RF Array Designer toolbox (Schmid & Partner Engineering AG, Zürich, Switzerland).

Numerical Analysis of the 16-Channel Loop-Coil/Dipole Antenna Array—Kidney & Heart Due to larger size and more complex geometries of the kidneys and heart compared to the prostate, optimizing for $B_1^+$ efficiency is frequently insufficient for these targets. In order to address this issue, tradeoff solutions between homogeneity and efficiency are generally used when $B_1^+$ shimming. Therefore, anatomy specific safe power limits for the 16-Channel Loop-coil/Dipole Antenna Array were determined using the worst-case 10 g-averaged SAR from phase-only shim solutions for the kidney and heart when driving all elements with equal power. To accomplish this, the 16-Channel Loop-coil/Dipole Antenna Array was modeled around the torso of the Duke model centered at the level of the kidneys and the heart. VOPs were determined from the 10 g-average SAR Q-matrices using the same methods described above, and TAP limits were calculated yielding 20 W/kg peak local SAR with the worst-case phase-only shimming at each imaging location.

In vivo imaging was performed on six healthy volunteers with the 16-Channel Loop-coil/Dipole Antenna Array after providing informed written consent to participate in an institutionally approved protocol on a whole-body Magnetom 7 Tesla scanner (Siemens Healthcare, Erlangen, Germany). The system is equipped with sixteen 1 kW power amplifiers managed through a separate phase and gain controller (Communications Power Corporation, Hauppauge, N.Y.) and a custom built power monitoring system. The elements of the 16-Channel Loop-coil/Dipole Antenna Array were connected to a 16-channel transmit/receive box (Virtumed LLC, Minneapolis Minn.) using RG-400 type co-axial cables.

Figure 6A:
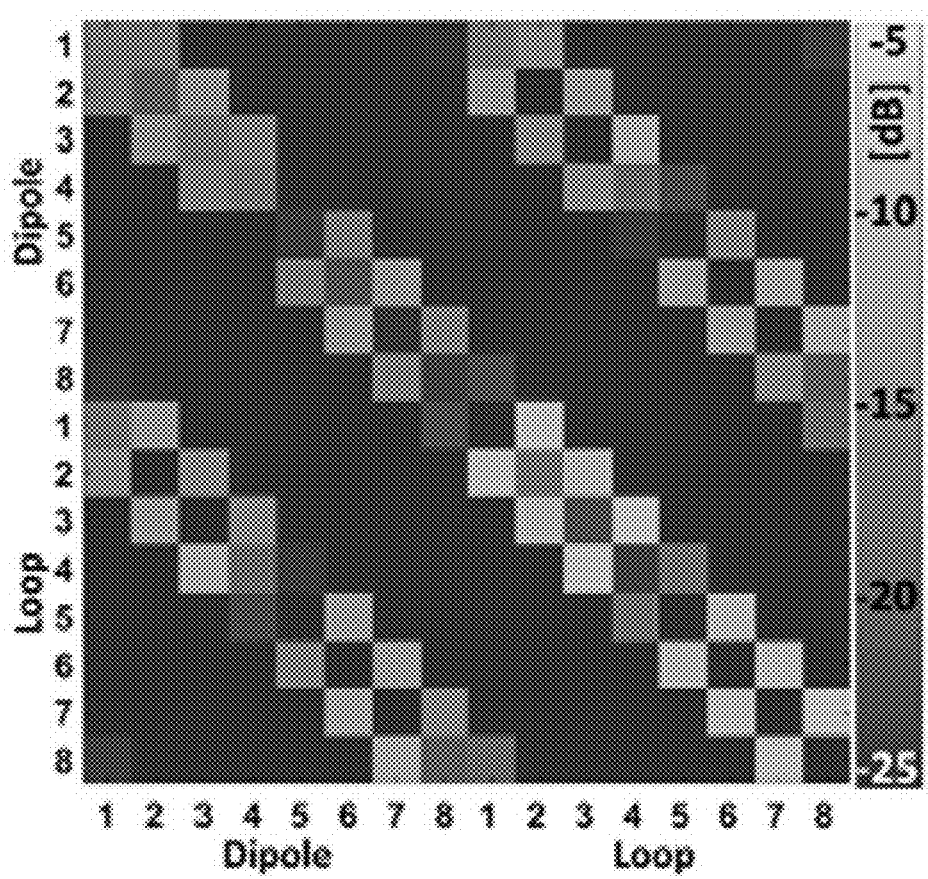
FIG. 6a is a plot showing the magnitude of a numerically computed scattering parameter matrix of a 16-channel loop-coil/dipole antenna array.

A numerically computed S-parameter matrix 600 of the 16-Channel Loop-coil/Dipole Antenna Array when placed around the Duke model is shown in FIG. 6a, with matrix indices of 1 to 8 showing the dipole elements and 9 to 16 showing the loop-coil elements. Reflection parameters of the channels were less than −16.5 dB (mean: −21.5 dB). Coupling between the loop and dipole elements in the same LD block was less than −17.4 dB (mean: −22.6 dB), showing that the symmetrical placement of the loop and dipole elements was sufficient to decouple these elements. The highest amount of coupling occurred between neighboring loop elements (mean, max: −12.2 dB, −9.9 dB) while average coupling between the neighboring dipole elements was −15.9 dB (max: −14.4 dB). Finally, the amount of coupling between neighboring dipole and loop elements were on average −13.8 dB (max: −12.7 dB). A simulated scattering matrix indicated an adequate decoupling performance between the elements of the 16-Channel Loop-coil/Dipole Antenna Array without the use of capacitive and/or inductive decoupling networks.

The 16-Channel Loop-coil/Dipole Antenna Array was further compared against two existing transceiver body arrays which have been previously characterized, including a 16-channel microstrip line array (16ML) and a 10-channel version of the fractionated dipole antenna array (10DA) (M R Coils, B. V., Drunen, The Netherlands). These comparisons, including both simulation and experimental results, were performed in the pelvis with the prostate as the target anatomy. Simulations for the two arrays followed the same methods described above with the exception that the 16ML was positioned 1.5 cm from the body, in contrast to the 1 cm gap for the 16-Channel Loop-coil/Dipole Antenna Array and 10DA. The in vivo results of the 16ML and 10DA used for comparison were reproduced from a previous study which involved five healthy male volunteers with BMIs and AP dimensions covering a similar range as the current study.

Figure 6B:
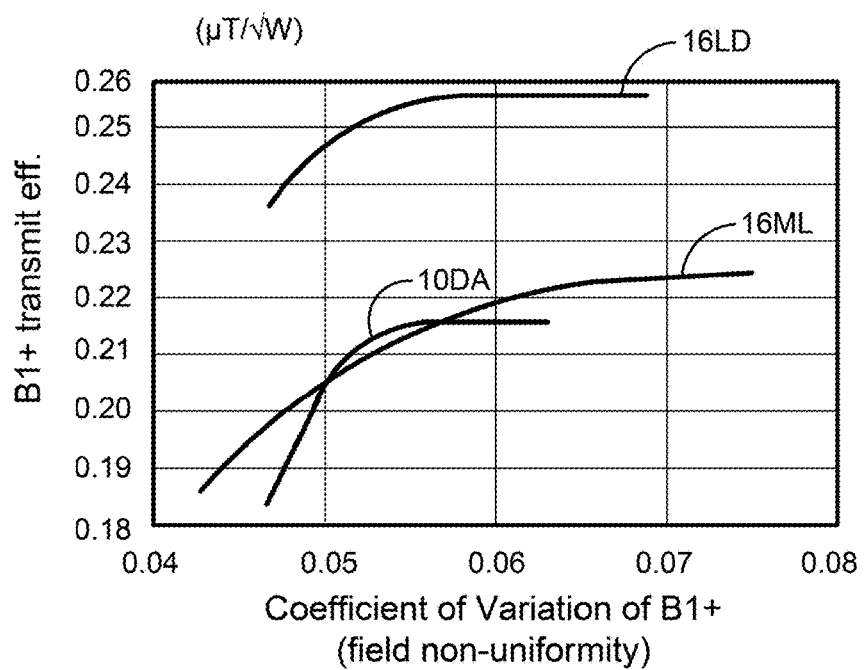
FIG. 6b is a plot showing the $B_1^+$ transmission efficiency of a 16-channel loop-coil/dipole antenna array, a 16ML array, and a 10DA array in a pelvic analysis.
Figure 6C:
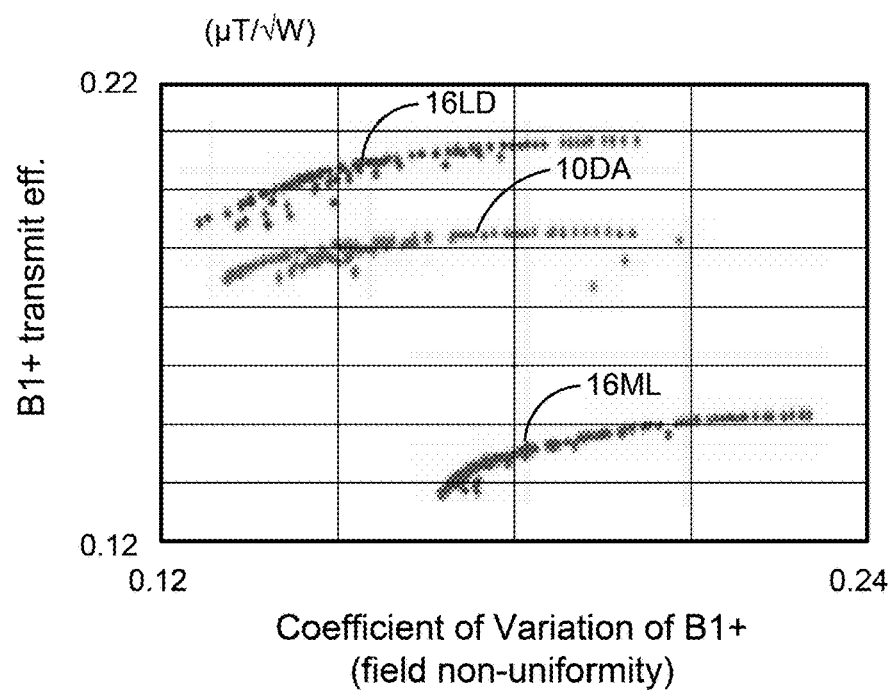
FIG. 6c is a plot showing the $B_1^+$ transmission efficiency of a 16-channel loop-coil/dipole antenna array, a 16ML array, and a 10DA array in a kidney analysis.
Figure 6D:
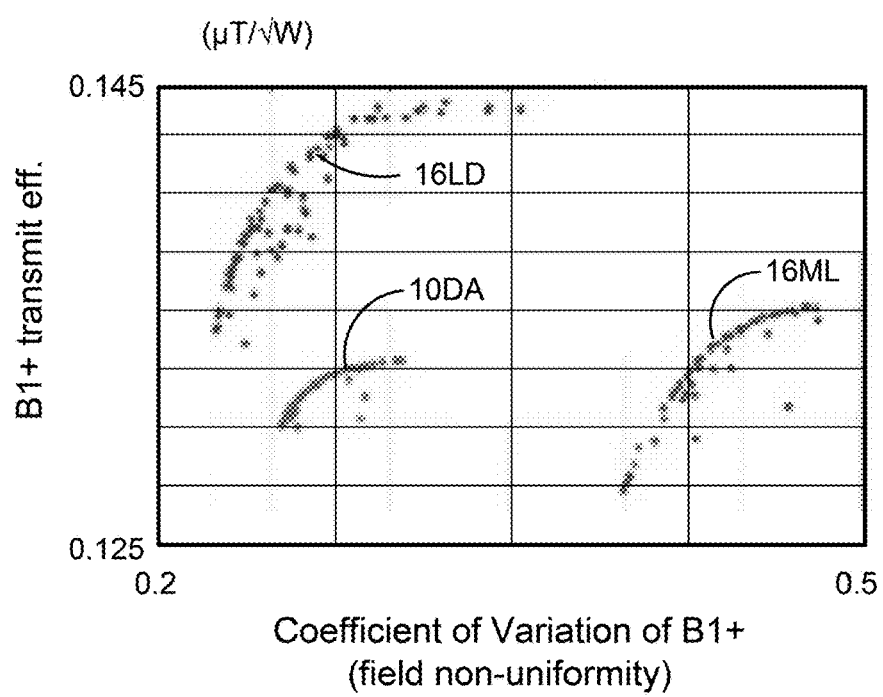
FIG. 6d is a plot showing the $B_1^+$ transmission efficiency of a 16-channel loop-coil/dipole antenna array, a 16ML array, and a 10DA array in a kidney analysis.

Transmit performance metrics of the 16-Channel Loop-coil/Dipole Antenna Array, 16ML and 10DA with both amplitude and phase shimming targeting either maximum $B_1^+$ transmit efficiency or $B_1^+$ SAR efficiency in the prostate are listed in Table 1, shown below. Under these conditions the 16-Channel Loop-coil/Dipole Antenna Array provided 13.7% and 18.3% higher $B_1^+$ transmit efficiency, 9.2% and 26.5% higher $B_1^+$ SAR efficiency over the 16ML and 10DA, respectively. Additionally, the simulation results with regards to $B_1^+$ transmission efficiency can be seen in FIGS. 6b, 6c and 6d relating to the pelvis, kidney, and heart studies, respectively Simulated transmit performance metrics of the 16ML and 10DA with prostate $B_1^+$ efficiency phase-only shim settings are also listed in Table 2 for comparison with the 16-Channel Loop-coil/Dipole Antenna Array. $B_1^+$ transmit efficiency of the 16-Channel Loop-coil/Dipole Antenna Array was more

TABLE 1

| Shim Target → | $B_1^+$ transmit efficiency | | | $B_1^+$ SAR efficiency | | |
|---|---|---|---|---|---|---|
| Coil | $\dfrac{SAR_{10g}}{P_{coil}}$ [W/kg] | $B_1^+$ transmit efficiency $\left[\dfrac{\mu T}{\sqrt{W}}\right]$ | $B_1^+$ SAR efficiency $\left[\dfrac{\mu T}{\sqrt{W/kg}}\right]$ | $\dfrac{SAR_{10g}}{P_{coil}}$ [W/kg] | $B_1^+$ transmit efficiency $\left[\dfrac{\mu T}{\sqrt{W}}\right]$ | $B_1^+$ SAR efficiency $\left[\dfrac{\mu T}{\sqrt{W/kg}}\right]$ |
| 16LD-All channels | 0.400 | 0.291 | 0.460 | 0.122 | 0.237 | 0.678 |
| 16LD-Loop-only (8ch) | 0.460 | 0.195 | 0.288 | 0.136 | 0.161 | 0.436 |
| 16LD-Dipole-only (8ch) | 0.365 | 0.225 | 0.372 | 0.143 | 0.197 | 0.520 |
| 16ML | 0.391 | 0.256 | 0.410 | 0.077 | 0.172 | 0.621 |
| 10DA | 0.401 | 0.246 | 0.388 | 0.142 | 0.202 | 0.536 |

Numerically computed transmit performance metrics of the 16-Channel Loop-coil/Dipole Antenna Array with phase-only $B_1^+$ efficiency shim settings at various relative power levels between all loop and dipole elements are listed in Table 2, below. The metrics include peak 10 g averaged SAR, TAP limits, $B_1^+$ transmit efficiency, $B_1^+$ SAR efficiency and peak $B_1^+$. Dipole-only and loop-only 8-channel excitations show that the dipole elements are more efficient than loop elements in this configuration. Two particular excitation schemes are printed in bold face type in Table 2. The first is when the maximum peak power was applied to all channels generating the highest peak $B_1^+$ of 23.3 µT in simulation. The second is when the loops were attenuated by 7 dB relative to the dipoles which provided high $B_1^+$ transmit and SAR efficiencies compared to the other scenarios. These two excitation schemes were employed in vivo.

than 15% higher than both the 16ML and 10DA. Compared to the 16ML and 10DA, the $B_1^+$ SAR efficiency of the 16-Channel Loop-coil/Dipole Antenna Array was 15.1% and 23.2% higher and the peak $B_1^+$ was 14.2% and 50.3% higher, respectively.

Figure 7:
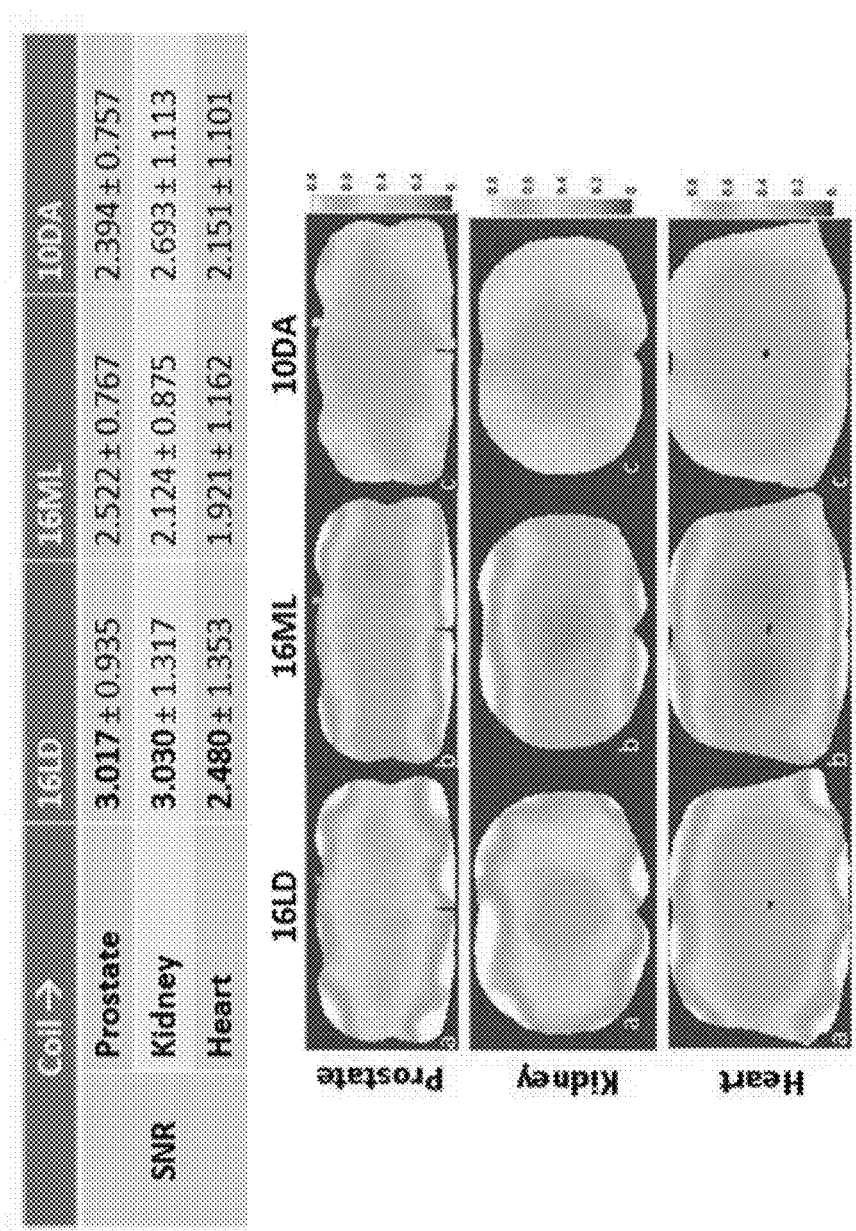
FIG. 7 is a numerically computed SNR distribution on an axial slice intersecting a prostate, a kidney and a heart in a simulated subject.

The numerically computed SNR distributions of the 16-Channel Loop-coil/Dipole Antenna Array, 16ML and 10DA are shown in FIG. 7, and the mean SNR inside the prostate are listed in Table 2, above. The SNR of the 16-Channel Loop-coil/Dipole Antenna Array from simulation was 19.6% and 26.0% higher than 16ML and 10DA, respectively. The 16-Channel Loop-coil/Dipole Antenna Array outperformed both 16ML and 10DA in terms of $B_1^+$ transmit efficiency, $B_1^+$ SAR efficiency, and SNR by at least 15% in simulations on the Duke model.

Additionally, safety limits for kidney and heart imaging were analyzed. Worst-case 10 g-averaged local SAR nor-

TABLE 2

| Coil | Excitation scheme | $\dfrac{SAR_{10g}}{P_{coil}}$ [W/kg] | TAP limit [W] per channel | | | $B_1^+$ transmit efficiency $\left[\dfrac{\mu T}{\sqrt{W}}\right]$ | $B_1^+$ SAR efficiency $\left[\dfrac{\mu T}{\sqrt{W/kg}}\right]$ | Peak-$B_1^+$ [µT] | SNR [a,u] |
|---|---|---|---|---|---|---|---|---|---|
| | | | total | Dipole | Loop | | | | |
| 16LD | Dipole + Loop | 0.269 | 74.4 | 4.65 | 4.65 | 0.258 | 0.497 | 23.3 | |
| | Dipole + Loop(−1 dB) | 0.266 | 75.1 | 5.23 | 4.16 | 0.259 | 0.502 | 22.2 | |
| | Dipole + Loop(−2 dB) | 0.263 | 76.2 | 5.84 | 3.68 | 0.260 | 0.506 | 21.2 | |
| | Dipole + Loop(−3 dB) | 0.258 | 77.5 | 6.45 | 3.24 | 0.259 | 0.510 | 20.3 | |
| | Dipole + Loop(−4 dB) | 0.253 | 79.1 | 7.07 | 2.81 | 0.258 | 0.513 | 19.5 | |
| | Dipole + Loop(−5 dB) | 0.247 | 80.9 | 7.68 | 2.48 | 0.256 | 0.515 | 18.8 | |
| | Dipole + Loop(−6 dB) | 0.241 | 82.9 | 8.28 | 2.08 | 0.254 | 0.517 | 18.2 | 3.017 |
| | Dipole + Loop(−7 dB) | 0.236 | 84.9 | 8.85 | 1.77 | 0.251 | 0.518 | 17.6 | |
| | Dipole + Loop(−8 dB) | 0.230 | 87.1 | 9.40 | 1.49 | 0.249 | 0.519 | 17.1 | |
| | Dipole + Loop(−9 dB) | 0.224 | 89.3 | 9.91 | 1.25 | 0.246 | 0.519 | 16.7 | |
| | Dipole + Loop(−10 dB) | 0.219 | 91.4 | 10.39 | 1.04 | 0.243 | 0.519 | 16.3 | |
| | Dipole-only (8 ch) | 0.222 | 90.1 | 11.27 | 0.00 | 0.204 | 0.433 | 13.0 | |
| | Loop-only (8 ch) | 0.356 | 56.3 | 0.00 | 7.03 | 0.165 | 0.277 | 10.6 | |
| 16ML | | 0.250 | 80.1 | 5.01 | | 0.225 | 0.451 | 20.4 | 2.522 |
| 10DA | | 0.265 | 75.5 | 7.55 | | 0.217 | 0.421 | 15.5 | 2.394 | malized to unit total coil power for phase-only shim solutions were determined to be 2.76 and 2.36 W per channel for the kidney and heart, respectively.

Figure 8A:
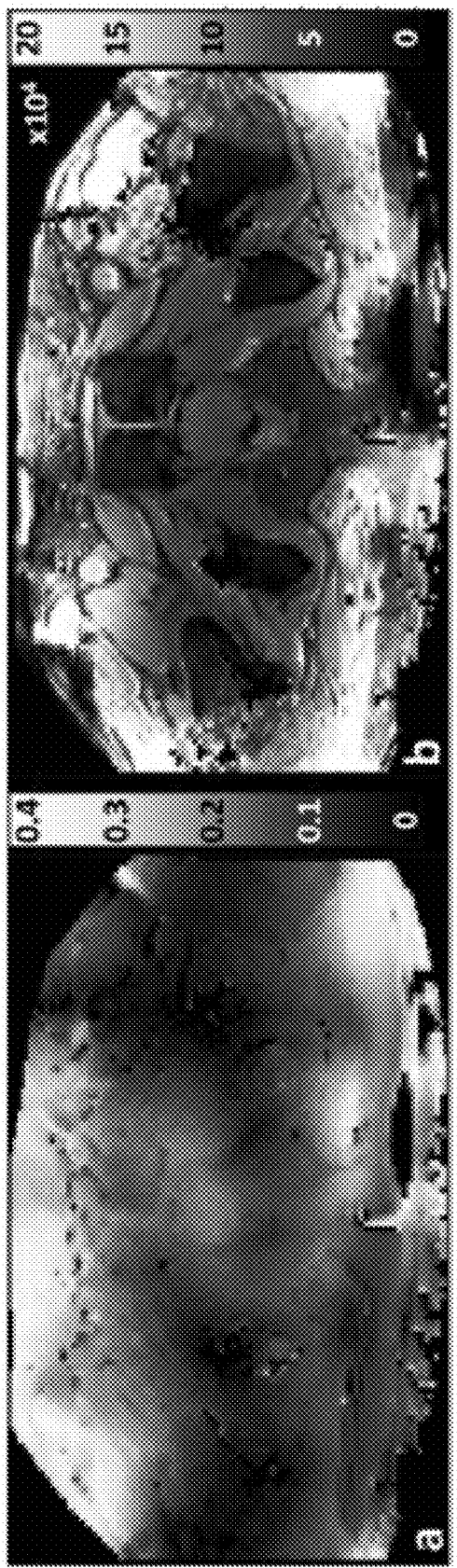
FIG. 8a is an experimentally acquired $B_1^+$ transmission efficiency plot and a SNR distribution along a pelvic axial slice intersecting a prostate on a subject with a Body Mass Index (BMI) of 27.9 kg/m$^2$.
Figure 8B:
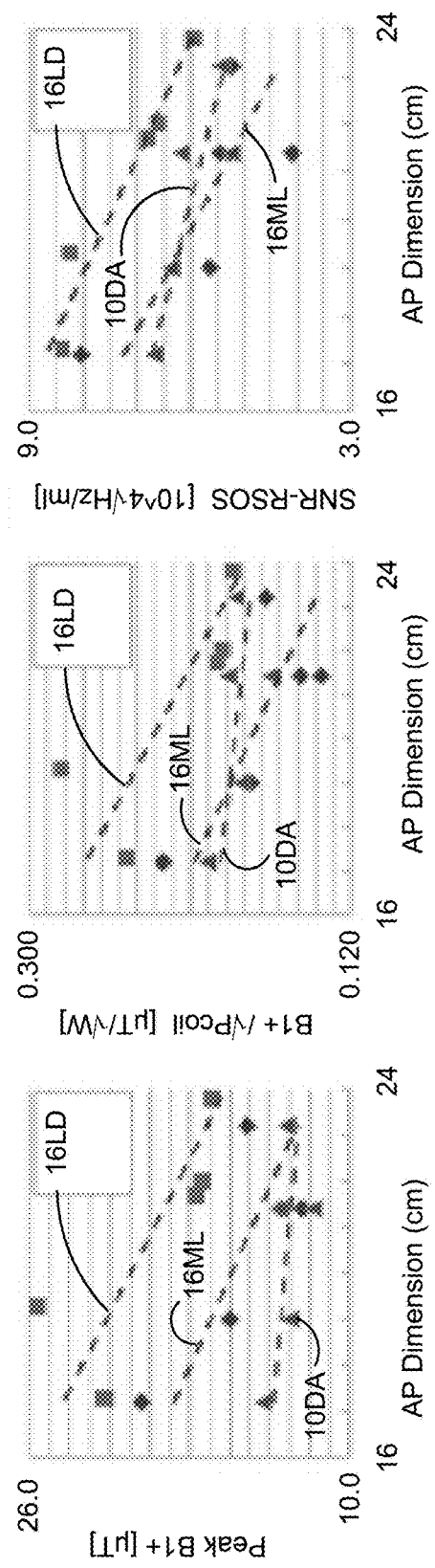
FIG. 8b depicts experimentally-acquired peak B1+ (in μT) on the left, B1+ transmit efficiency (in μT/√W) in the middle, and SNR (in $10^4$ √Hz/ml) on the right versus anterior-posterior (AP) pelvic dimensions (in cm) of 16LD, 16ML, and 10DA inside the prostate of healthy subjects.

Turning now to FIG. 8a, a $B_1^+$ transmit efficiency and SNR distribution along an axial slice intersecting the prostate of a subject with a BMI=26.9 kg/m² is shown. Experimentally measured $B_1^+$ transmit efficiency, peak $B_1^+$ and SNR of the 16-Channel Loop-coil/Dipole Antenna Array inside the prostate are listed in Table 3, below, in comparison to the 16ML and 10DA. A plot of the experimental results can further be seen in FIG. 8b. Compared to the 16ML and 10DA, the 16-Channel Loop-coil/Dipole Antenna Array had on average, 29.1% and 20.0% higher $B_1^+$ transmit efficiency, 29.1% and 51.8% higher peak $B_1^+$, and 26.9% and 20.4% higher SNR, respectively.

microstrip line and a 10-channel fractionated dipole antenna array in both simulations and experiments in terms of transmit and receive performance inside the prostate. MRI images of the prostate, kidneys and the heart were acquired using the 16LD on healthy subjects showing the potential of this RF coil design to successfully image targets throughout the torso and pelvis at 7T.

Experimental Methods

For prostate studies, 5 individuals were imaged with body mass indices (BMIs) ranging from 21.3 to 29.7 kg/m² (mean: 25.6 kg/m²) and with anterior-posterior (AP) pelvic dimensions ranging between 17.2 and 23.8 cm (mean: 20.8 cm). Subject-dependent RF shimming was performed to maximize $B_1^+$ fields inside the prostate (i.e. phase-only shimming) (26). $B_1^+$ maps were calculated from data

TABLE 3

| Coil | BMI kg/m² | Pelvic AP dimension cm | $B_1^+$ tansmit efficiency $\frac{\mu T}{\sqrt{W}}$ | Peak $B_1^+$ $\mu T$ | SNR $10^4 \sqrt{Hz}/m$ |
|---|---|---|---|---|---|
| 16LD | 25.6 ± 3.2 | 20.8 ± 2.5 | 0.221 ± 0.042 | 20.0 ± 3.8 | 7.21 ± 1.07 |
| 16ML | 26.1 ± 3.6 | 20.4 ± 2.3 | 0.171 ± 0.034 | 15.5 ± 3.1 | 5.68 ± 1.45 |
| 10DA | 26.1 ± 3.6 | 20.3 ± 2.3 | 0.184 ± 0.013 | 13.2 ± 0.9 | 5.99 ± 0.61 |

Average g-factors of the 16-Channel Loop-coil/Dipole Antenna Array in a 4 cm² square region mimicking the size and location of the prostate inside the torso sized phantom are listed in Table 4. The additional SNR penalty due to parallel imaging was on average less than 20% if the reduction factor was equal to or smaller than 6.

acquired with the actual flip angle technique (34) ($TR_1/TR_2$/TE: 20/120/3 ms, FA=50°, acquisition-matrix: 128×128×24, voxel-size: 2.7×2.7×5 mm³). Transmit performance was evaluated in terms of $B_1^+$ normalized to unit total coil power and peak $B_1^+$. SNR was calculated by acquiring a fully relaxed gradient echo sequence (TR/TE: 10 s/3.1 ms,

TABLE 4

| | | | Reduction in L-R dimensions | | | | | |
|---|---|---|---|---|---|---|---|---|
| | | | 1 | 2 | 3 | 4 | 5 | 6 |
| Simulated (Duke) | Reduction in A-P dimensions | 1 | 1.00 ± 0.00 | 1.02 ± 0.02 | 1.04 ± 0.01 | 1.06 ± 0.03 | 1.28 ± 0.03 | 1.65 ± 0.05 |
| | | 2 | 1.07 ± 0.07 | 1.09 ± 0.08 | 1.14 ± 0.07 | 1.24 ± 0.13 | 1.49 ± 0.16 | 2.03 ± 0.27 |
| Experimental (Phantom) | | 1 | 1.00 ± 0.00 | 1.00 ± 0.00 | 1.03 ± 0.01 | 1.05 ± 0.03 | 1.04 ± 0.02 | 1.15 ± 0.05 |
| | | 2 | 1.11 ± 0.06 | 1.13 ± 0.07 | 1.17 ± 0.08 | 1.24 ± 0.10 | 1.27 ± 0.13 | 1.47 ± 0.20 |

Figure 9:
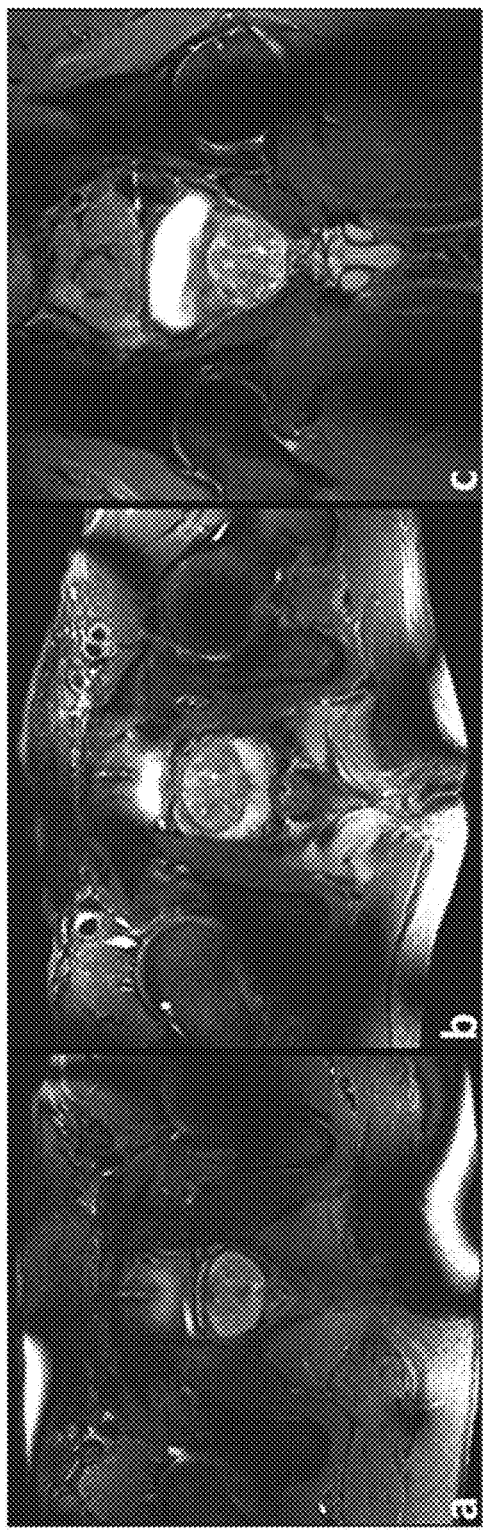
FIG. 9 is an axial and coronal T2-weighted TSE image of the prostate at 0.5×0.5 mm$^2$ in-plane resolution acquired on two different subjects.
Figure 10:
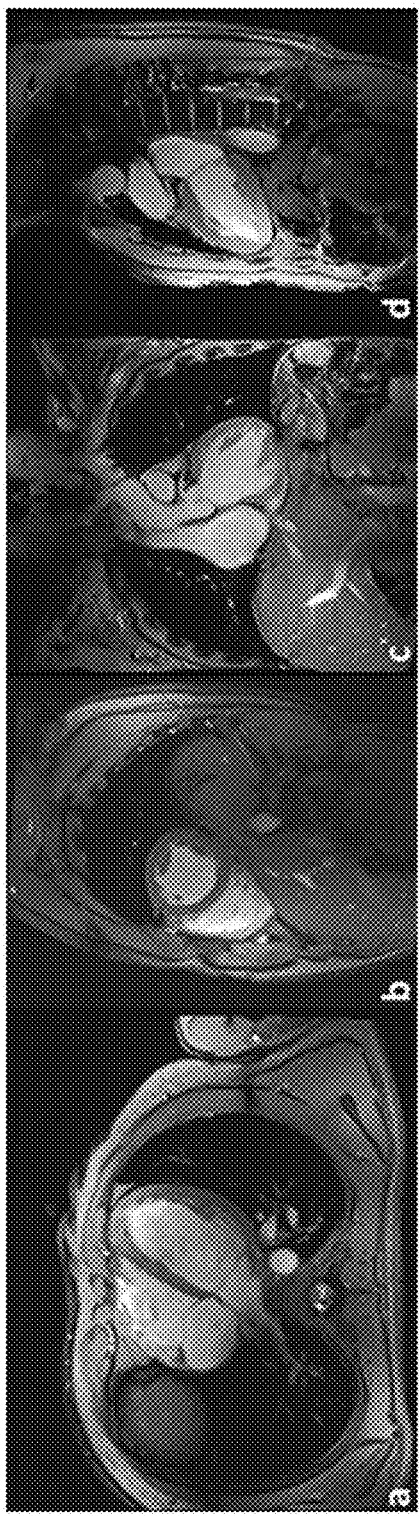
FIG. 10 is a coronal and axial fat suppressed T1-weighted GRE image of the kidney acquired on a subject with a BMI of 26.9 kg/m$^2$, and a 25 mm MIP of a multi-slice 2D imaging series at the level of the renal arteries.

Representative axial and coronal T2-weighted TSE images of the prostate from two of the five healthy subjects imaged can be seen in FIG. 9. Anatomic MRI of the kidneys along coronal and axial slices are shown in FIG. 10. A 25 mm thin slab maximum intensity projection (MIP) of the multi-slice GRE acquisition at the level of the renal arteries is further shown.

Figure 11:
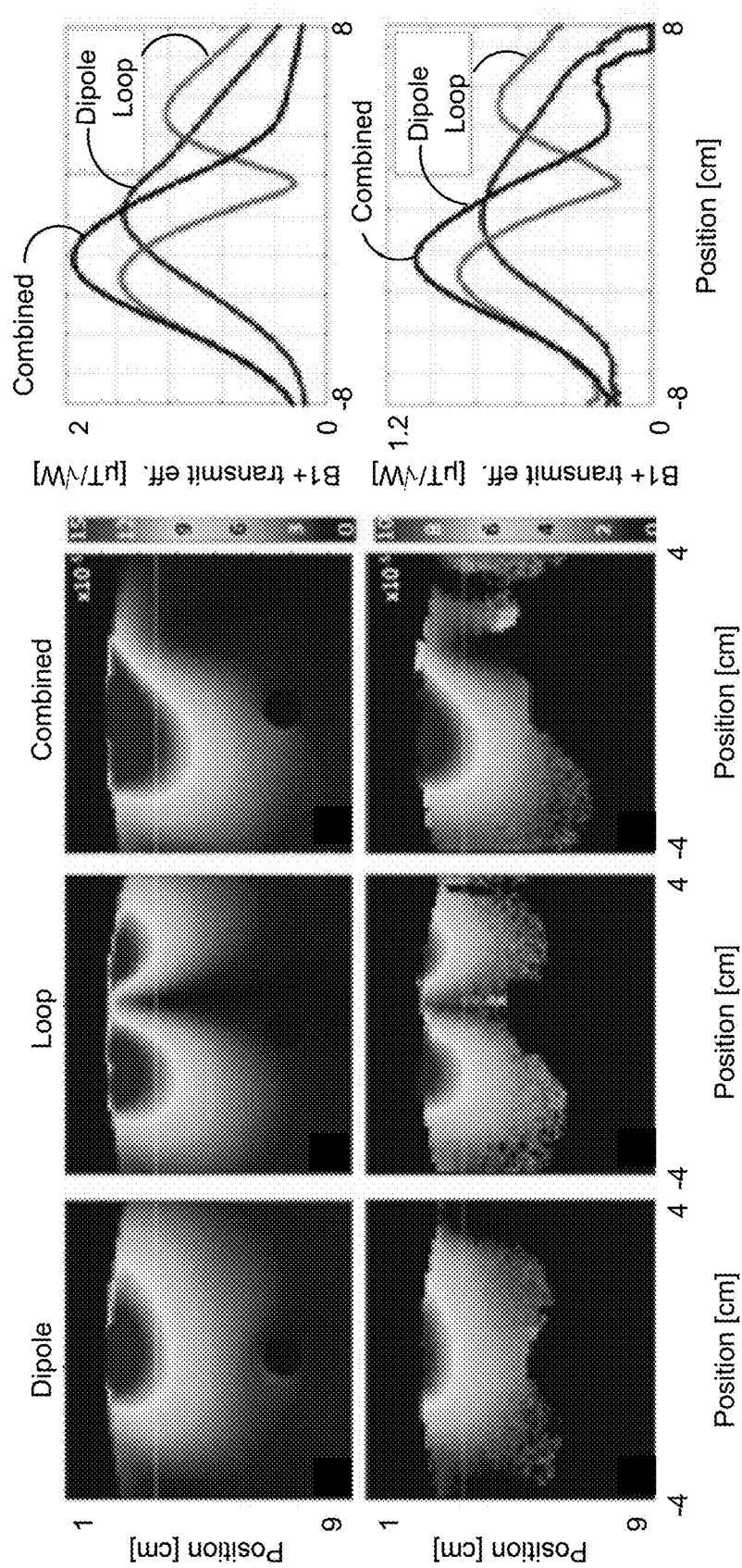
FIG. 11 is a simulated and experimentally acquired $B_1^+$ transmission efficiency distribution inside a torso phantom for dipole-only, loop-coil-only and loop-coil/dipole antenna transceivers for combined excitations.

Turning now to FIG. 11, single frames of a four chamber view, a short axis view, a straight coronal through the left ventricular outflow tract view, and a two chamber long axis view of a heart are shown. As shown in the four chamber view and the straight-coronal view, fine structures such as the heart valves and left coronary artery can be observed.

The above results illustrate that the loop-coil/dipole antenna arrays described above, maintained both a higher transmit and receive performance of the loop-coil elements at shallower depths and the improved performance of the dipole antenna elements at greater depths. Additionally, the loop-coil/dipole antenna combinations increased channel count and density beyond what can be currently achieved when using dipole elements alone. Further, the 16-Channel Loop-coil/Dipole Antenna Array outperformed a 16-channel FA=90°, voxel-size: 2.7×1.4×3 mm³) and a noise scan using the methods of Edelstein et al. Post-processing of the acquired data was performed in Matlab where prostate regions were drawn manually slice-by-slice to quantify $B_1^+$ transmit efficiency, peak $B_1^+$ and SNR of the 16LD.

Parallel imaging performance of the 16-Channel Loop-coil/Dipole Antenna Array was investigated by computing g-factors on SNR acquisitions performed in a torso-sized phantom. The g-factors corresponding to reduction factors (R) of 1 to 6 fold in the left-right (LR) and 1 to 2 fold in the anterior-posterior (AP) directions were calculated.

For renal and cardiac imaging, $B_1^+$ shimming was performed with different optimization goals. For the kidney, phase-only shimming optimized for field homogeneity with a targeted RF efficiency of 50% was used. For cardiac imaging a single static shim setting optimized for $B_1^+$ homogeneity over the entire heart was employed.

Further, in order to assess the accuracy of the numerical simulations, the $B_1^+$ transmit efficiency of the LD block was investigated both numerically and experimentally on a torso-sized phantom (ε=77.8, σ=0.82 S/m) using the FDTD solver of SEMCAD. $B_1^+$ transmit efficiency was measured experimentally on the torso sized phantom filled with a saline solution (4.5 g/l NaCl, 1 g/l CuSO$_4$) giving the permittivity and conductivity used in the simulation. The MRI system and methods used for measuring the $B_1^+$ transmit efficiency are described above.

Numerically computed and experimentally calculated $B_1^+$ distributions of a LD block with dipole-only, loop-only and dipole-loop $B_1^+$ efficiency optimized combined excitations are shown in FIG. 10 (top row: simulations, bottom row: experiments). Simulation and experimental results are in close agreement.

To evaluate the accuracy of the 16-Channel Loop-coil/Dipole Antenna Array numerical model, $B_1^+$ distributions of the 16-Channel Loop-coil/Dipole Antenna Array on the torso phantom were simulated and experimentally measured using the same configuration. Phase-only $B_1^+$ efficiency shimming inside a 4 cm$^2$ region mimicking the size and location of the prostate was performed. $B_1^+$ distributions for dipole-only, loop-only, dipole-loop combined at equal power and dipole-loop combined with loop excitation power attenuated by 7 dB were calculated both numerically and experimentally. Flip angle maps were acquired using the methods detailed above and scaled to yield $B_1^+$ distributions in µT.

Figure 12:
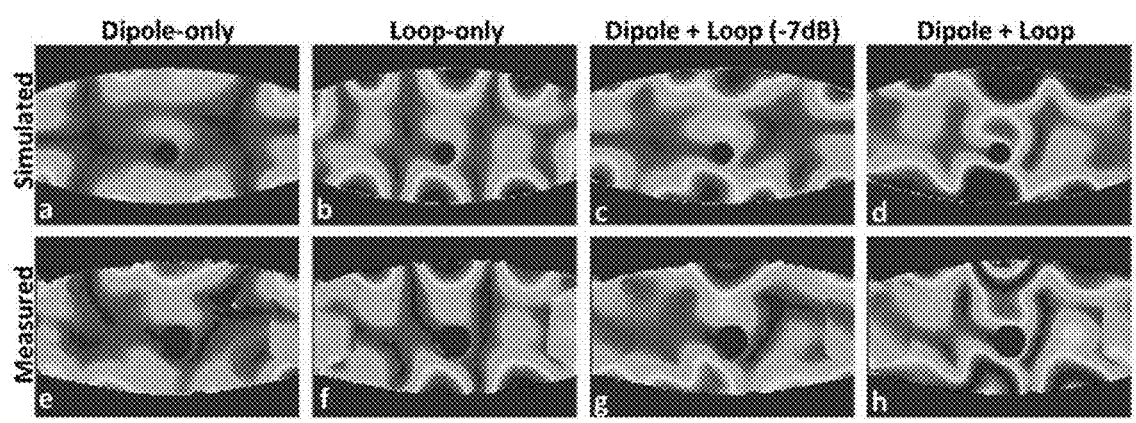
FIG. 12 is a simulated and experimentally acquired $B_1^+$ distribution of a 16-channel loop-coil/dipole antenna array inside the phantom for differing excitation schemes.

Numerically computed and experimentally calculated $B_1^+$ distributions of the 16-Channel Loop-coil/Dipole Antenna Array with dipole-only, loop-only, dipole-loop combined excitation where the loop excitation power is either attenuated by 7 dB or at equal power compared to the dipole are shown in FIG. 12 (top row: simulations, bottom row: experiments). Simulated $B_1^+$ transmit efficiency distributions demonstrate good agreement with the experimental results.

Anatomic and Functional MRI Acquisitions

For all prostate studies, T2-weighted images were obtained using a turbo spin-echo (TSE) sequence (TR/TE: 6000/74 ms, FOV: 220×220 mm$^2$, voxel-size: 0.5×0.5×3 mm$^3$, 13 slices, duration: 3 m 43 s).

Anatomic images of the kidneys were acquired with an interleaved multi-slice, fat-suppressed gradient echo (GRE) sequence (TR/TE: 120/2.8 ms, FOV: 350×350 mm$^2$, acquisition voxel-size: 1.2×0.8×5 mm$^3$, GRAPPA R=2, 32 slices, duration: 23 s). For visualizing the vessels, a sequentially acquired multi-2D, fat-suppressed GRE sequence was performed (TR/TE: 4.5/1.9 ms, FOV: 270×360 mm$^2$, acquisition voxel-size: 1.4×1.1×3 mm$^3$, duration: 18 s).

Cardiac functional imaging consisted of cine acquisitions obtained during a single breath-hold with a 2D retrospectively ECG-gated GRE sequences (FOV: 277×339 mm$^2$, acquisition voxel-size: 1.4×1.1×4 mm$^3$, GRAPPA R=2, duration: 14 s). Short-axis, long-axis and straight-coronal views of the heart were acquired with flow compensation using the following acquisition parameters (TR/TE: 66/2.8 ms). The four-chamber view was acquired without flow compensating gradients (TR/TE: 50/1.8 ms).

Figure 13:
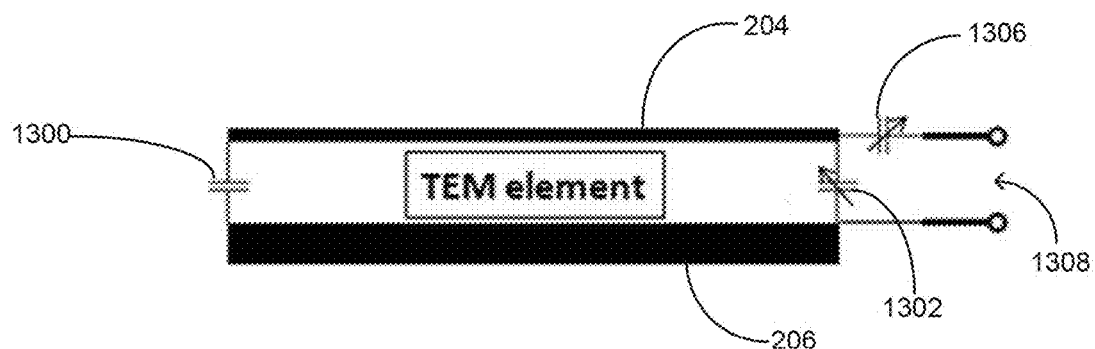

Turning now to FIG. 13, a side view of the single TEM-loop block 200 described in FIG. 2a can be seen. Here, the TEM element 203 can be seen. Further the TEM-loop block 200 can include a first tuning capacitor 1300 and a second tuning capacitor 1302. In one configuration, the first tuning capacitor 1300 can be a fixed value capacitor, and the second tuning capacitor 1302 can be an adjustable value capacitor. Alternatively, the first tuning capacitor 1300 can be an adjustable value capacitor, and the second tuning capacitor 1302 can be a fixed capacitor. Further, in some configurations, both the first tuning capacitor 1300 and the second tuning capacitor 1302 can be fixed value capacitors or adjustable value capacitors. The first tuning capacitor 1300 and the second tuning capacitor 1302 can be used to tune the TEM element 203 to the MR frequency. Further, a matching capacitor 1306 can be coupled between the TEM element 203 and the input coil port 1308. In one configuration, the matching capacitor 1306 can be an adjustable value capacitor. Alternatively, the matching capacitor 1306 can be a fixed value capacitor. The matching capacitor can be used to match an impedance of the TEM-loop block 200 to an input device.

Figure 14:
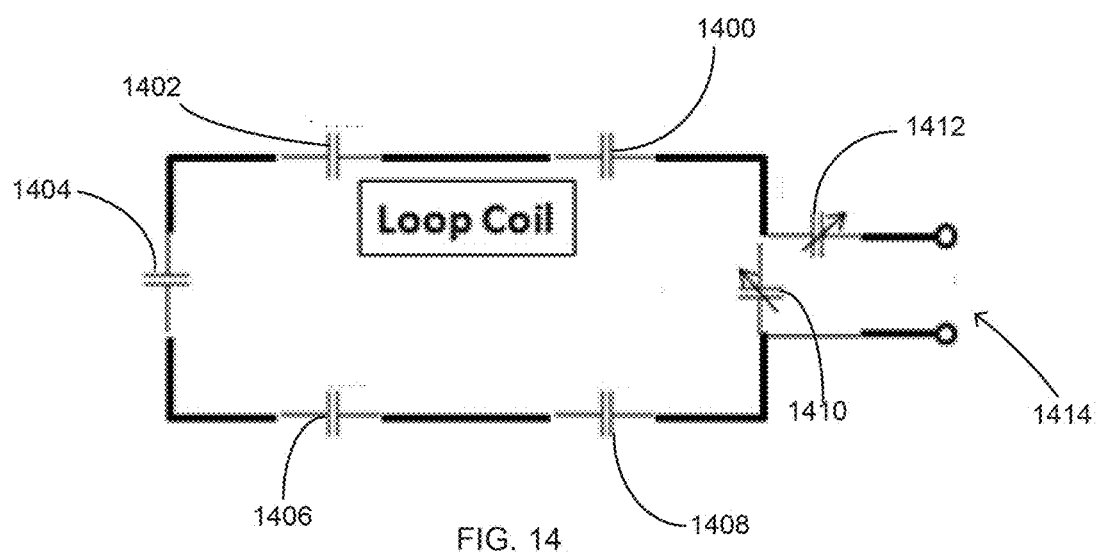

Turning now to FIG. 14, a top schematic view of the single TEM-loop block 200 described in FIG. 2a can be seen. Here, it can be seen that the loop-coil element 202 includes a plurality of tuning capacitors 1400, 1402, 1404, 1406, 1408. In one configuration the tuning capacitors 1400, 1402, 1404, 1406, 1408 are fixed value capacitors. Alternatively, the tuning capacitors 1400, 1402, 1404, 1406, 1408 can be adjustable value capacitors. The loop-coil element 202 can also include an adjustable input tuning capacitor 1410. The loop-coil element 202 can further include a matching capacitor 1412 at the input coil port 1414. The matching capacitor 1412 can be an adjustable value capacitor.

Figure 15:
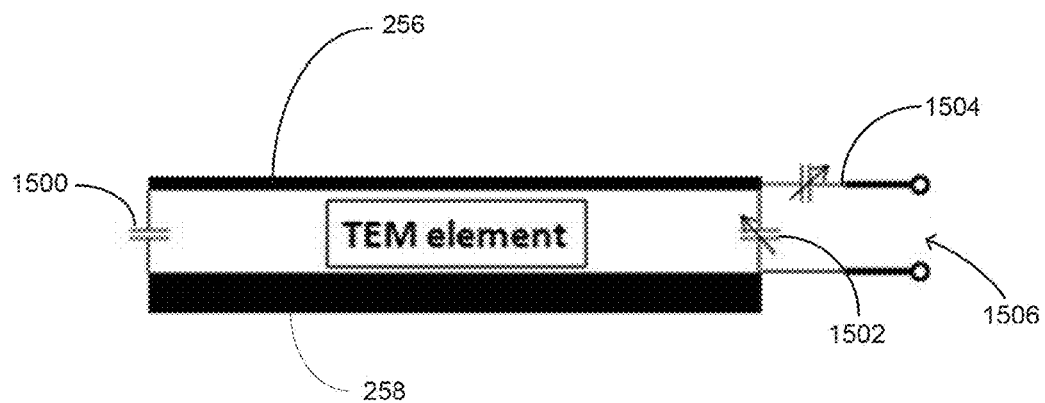
FIG. 15 is a side view of the alternate TEM-loop block described in FIG. 2b.

Turning now to FIG. 15, a side of the alternate TEM-loop block 250 described in FIG. 2b can be seen. Here, the TEM element 255 consisting of the top conductor 256, the bottom conductor 258 and the substrate material 260 can be seen. Additionally, the alternate TEM-loop block 250 can include a first tuning capacitor 1500 and a second tuning capacitor 1502. In one configuration, the first tuning capacitor 1500 can be a fixed value capacitor, and the second tuning capacitor 1502 can be an adjustable value capacitor. Alternatively, the first tuning capacitor 1500 can be an adjustable value capacitor, and the second tuning capacitor 1502 can be a fixed capacitor. Further, in some configurations, both the first tuning capacitor 1500 and the second tuning capacitor 1502 can be fixed value capacitors or adjustable value capacitors. The first tuning capacitor 1500 and the second tuning capacitor 1502 can be used to tune the TEM element 255 to the MR frequency. Further, a matching capacitor 1504 can be coupled between the TEM element 256 and the input coil port 1506. In one configuration, the matching capacitor 1504 can be an adjustable value capacitor. Alternatively, the matching capacitor 1504 can be a fixed value capacitor. The matching capacitor can be used to match an impedance of the alternate TEM-loop block 250 to an input device.

Figure 16:
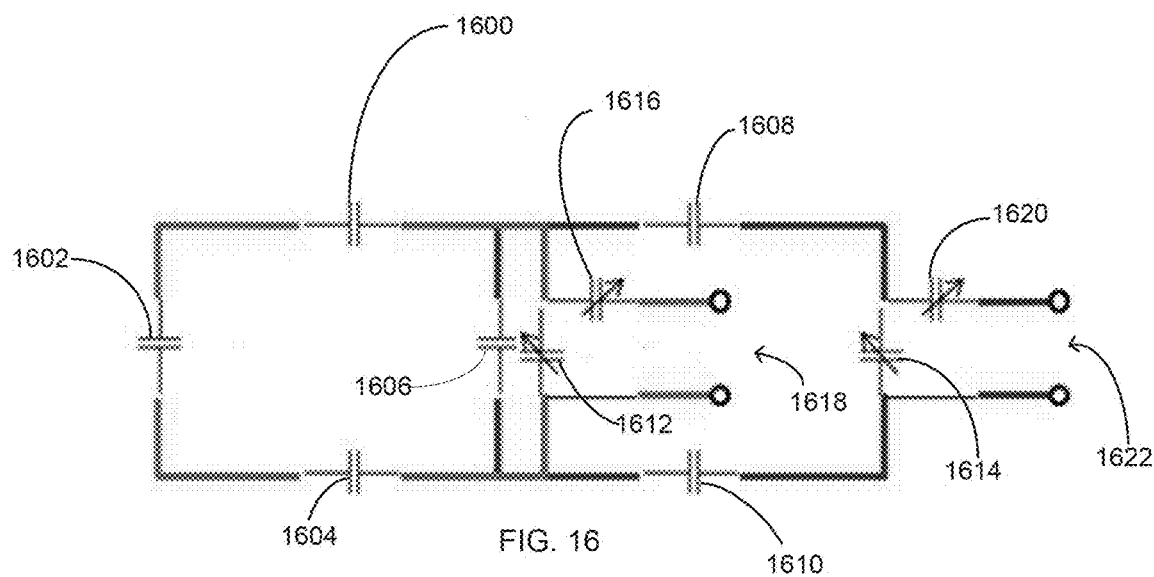
FIG. 16 is a top schematic view of the alternate TEM-loop block described in FIG. 2b.

Turning now to FIG. 16, a top schematic view of the alternate TEM-loop block 250 described in FIG. 2b can be seen. Here, the first loop-coil element 252 includes a first plurality of tuning capacitors 1600, 1602, 1604 and the second loop-coil element 254 can include a second plurality of fixed value tuning capacitors 1606, 1608, 1610. Alternatively, one or more of the first plurality of tuning capacitors 1600, 1602, 1604, can be adjustable value capacitors. Additionally, in some configuration, one or more of the second plurality of tuning capacitors 1606, 1608, 1610 can be adjustable value capacitors. The first loop-coil element 252 can also include a first adjustable input tuning capacitor 1612. Further, the second loop-coil element 254 can include a second adjustable input tuning capacitor 1614. The first loop-coil element 252 can further include a matching capacitor 1616 at the coil input port 1618 to the first loop-coil element 252. In one configuration, the matching capacitor 1616 can be an adjustable value capacitor. In other examples, the matching capacitor 1616 can be a fixed value capacitor. Additionally, the second loop-coil element 254 can further include a matching capacitor 1620 at the coil input port 1622 to the second loop-coil element 254. In one configuration, the matching capacitor 1620 can be an adjustable value capacitor. In other examples, the matching capacitor 1620 can be a fixed value capacitor.

Figure 17:
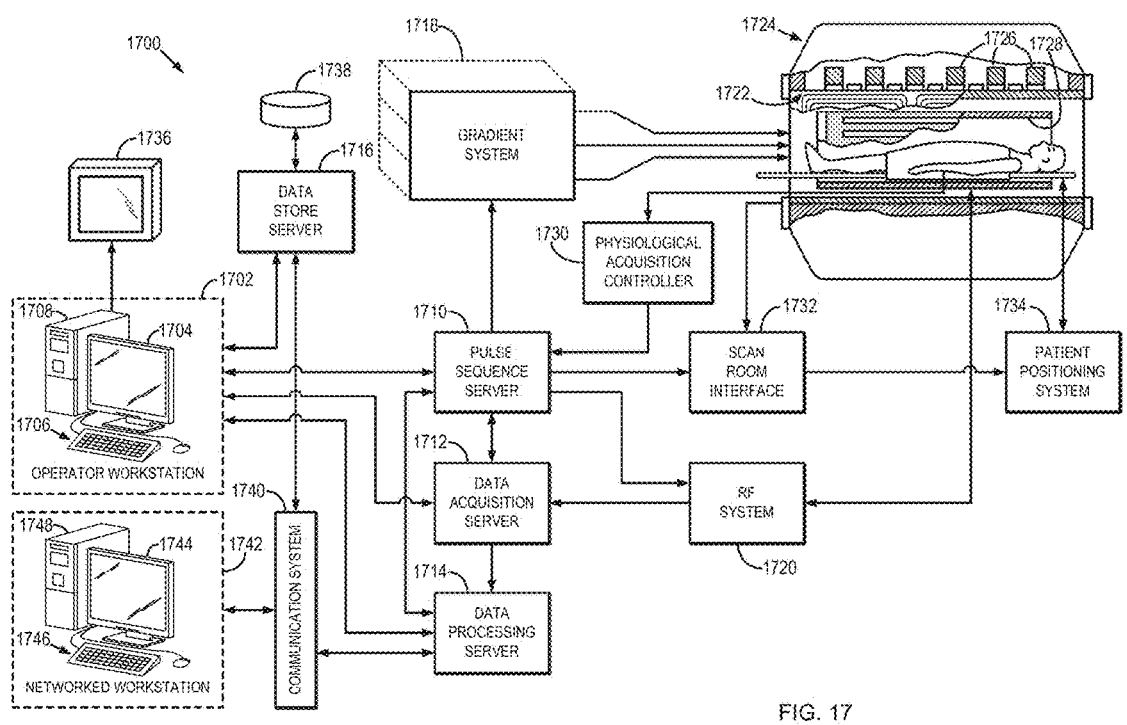
FIG. 17 is a block diagram of an example of a magnetic resonance imaging ("MRI") system.

Referring particularly now to FIG. 17, an example of a magnetic resonance imaging ("MRI") system 1700 is illustrated. The MRI system 1700 can be used with the hybrid transceivers described above. The MRI system 1700 includes an operator workstation 1702, which will typically include a display 1704; one or more input devices 1706, such as a keyboard and mouse; and a processor 1708. The processor 1708 may include a commercially available programmable machine running a commercially available operating system. The operator workstation 1702 provides the operator interface that enables scan prescriptions to be entered into the MRI system 1700. In general, the operator workstation 1702 may be coupled to four servers: a pulse sequence server 1710; a data acquisition server 1712; a data processing server 1714; and a data store server 1716. The operator workstation 1702 and each server 1710, 1712, 1714, and 1716 are connected to communicate with each other. For example, the servers 1710, 1712, 1714, and 1716 may be connected via a communication system 1740, which may include any suitable network connection, whether wired, wireless, or a combination of both. As an example, the communication system 1740 may include both proprietary or dedicated networks, as well as open networks, such as the internet.

The pulse sequence server 1710 functions in response to instructions downloaded from the operator workstation 1702 to operate a gradient system 1718 and a radiofrequency ("RF") system 1720. Gradient waveforms used to perform the prescribed scan are produced and applied to the gradient system 1718, which excites gradient coils in an assembly 1722 to produce the magnetic field gradients $G_x$, $G_y$, and $G_z$ used for position encoding magnetic resonance signals. The gradient coil assembly 1722 forms part of a magnet assembly 1724 that includes a polarizing magnet 1726 and a whole-body RF coil 1728.

RF waveforms are applied by the RF system 1720 to the RF coil 1728, or a separate local coil (not shown in FIG. 17), in order to perform the prescribed magnetic resonance pulse sequence. Responsive magnetic resonance signals detected by the RF coil 1728, or a separate local coil (not shown in FIG. 17), are received by the RF system 1720, where they are amplified, demodulated, filtered, and digitized under direction of commands produced by the pulse sequence server 1710. The RF system 1720 includes an RF transmitter for producing a wide variety of RF pulses used in MRI pulse sequences. The RF transmitter is responsive to the scan prescription and direction from the pulse sequence server 1710 to produce RF pulses of the desired frequency, phase, and pulse amplitude waveform. The generated RF pulses may be applied to the whole-body RF coil 1728 or to one or more local coils or coil arrays (not shown in FIG. 17).

The RF system 1720 also includes one or more RF receiver channels. Each RF receiver channel includes an RF preamplifier that amplifies the magnetic resonance signal received by the coil 1728 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \quad (1);$$

and the phase of the received magnetic resonance signal may also be determined according to the following relationship:

$$\varphi = \tan^{-1}\left(\frac{Q}{I}\right). \quad (2)$$

The pulse sequence server 1710 also optionally receives patient data from a physiological acquisition controller 1730. By way of example, the physiological acquisition controller 1730 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 1710 to synchronize, or "gate," the performance of the scan with the subject's heart beat or respiration.

The pulse sequence server 1710 also connects to a scan room interface circuit 1732 that receives signals from various sensors associated with the condition of the patient and the magnet system. It is also through the scan room interface circuit 1732 that a patient positioning system 1734 receives commands to move the patient to desired positions during the scan.

The digitized magnetic resonance signal samples produced by the RF system 1720 are received by the data acquisition server 1712. The data acquisition server 1712 operates in response to instructions downloaded from the operator workstation 1702 to receive the real-time magnetic resonance data and provide buffer storage, such that no data is lost by data overrun. In some scans, the data acquisition server 1712 does little more than pass the acquired magnetic resonance data to the data processor server 1714. However, in scans that require information derived from acquired magnetic resonance data to control the further performance of the scan, the data acquisition server 1712 is programmed to produce such information and convey it to the pulse sequence server 1710. For example, during prescans, magnetic resonance data is acquired and used to calibrate the pulse sequence performed by the pulse sequence server 1710. As another example, navigator signals may be acquired and used to adjust the operating parameters of the RF system 1720 or the gradient system 1718, or to control the view order in which k-space is sampled. In still another example, the data acquisition server 1712 may also be employed to process magnetic resonance signals used to detect the arrival of a contrast agent in a magnetic resonance angiography ("MRA") scan. By way of example, the data acquisition server 1712 acquires magnetic resonance data and processes it in real-time to produce information that is used to control the scan.

The data processing server 1714 receives magnetic resonance data from the data acquisition server 1712 and processes it in accordance with instructions downloaded from the operator workstation 1702. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 1714 are conveyed back to the operator workstation 1702 where they are stored. Real-time images are stored in a data base memory cache (not shown in FIG. 17), from which they may be output to operator display 1702 or a display 1736 that is located near the magnet assembly 1724 for use by attending physicians. Batch mode images or selected real time images are stored in a host database on disc storage 1738. When such images have been reconstructed and transferred to storage, the data processing server 1714 notifies the data store server 1716 on the operator workstation 1702. The operator workstation 1702 may be used by an operator to archive the images, produce films, or send the images via a network to other facilities.

The MRI system 1700 may also include one or more networked workstations 1742. By way of example, a networked workstation 1742 may include a display 1744; one or more input devices 1746, such as a keyboard and mouse; and a processor 1748. The networked workstation 1742 may be located within the same facility as the operator workstation 1702, or in a different facility, such as a different healthcare institution or clinic.

The networked workstation 1742, whether within the same facility or in a different facility as the operator workstation 1702, may gain remote access to the data processing server 1714 or data store server 1716 via the communication system 1740. Accordingly, multiple networked workstations 1742 may have access to the data processing server 1714 and the data store server 1716. In this manner, magnetic resonance data, reconstructed images, or other data may be exchanged between the data processing server 1714 or the data store server 1716 and the networked workstations 1742, such that the data or images may be remotely processed by a networked workstation 1742. This data may be exchanged in any suitable format, such as in accordance with the transmission control protocol ("TCP"), the internet protocol ("IP"), or other known or suitable protocols.

Figure 18:
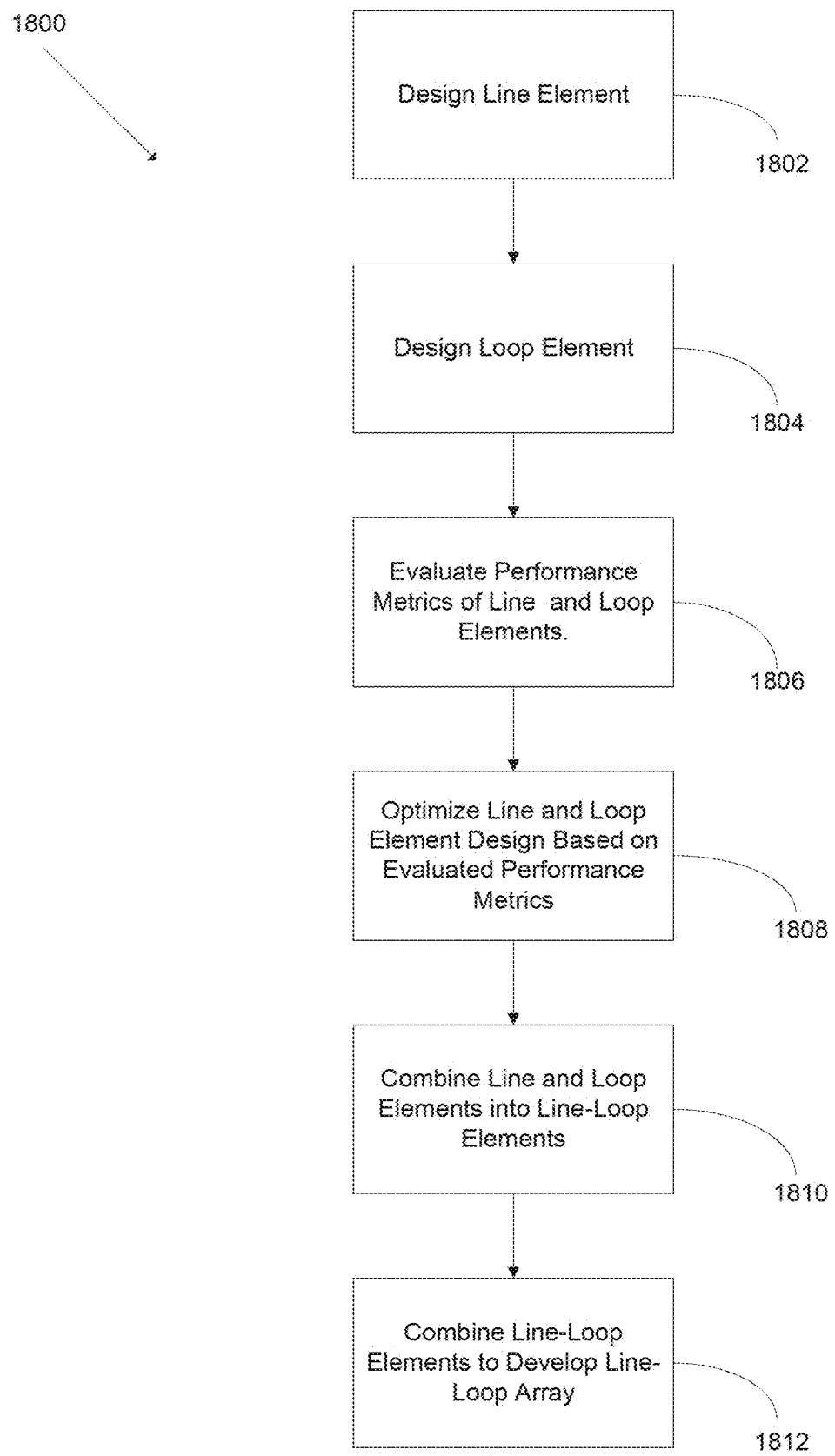
FIG. 18 is a flow-chart illustrating a hybrid antenna array design process.

Turning now to FIG. 18, a process 1800 for designing and constructing a hybrid transceiver array can be seen. At process block 1802, the line element can be designed. In one configuration, a first decision can be made to choose a specific type of line element. For example, a dipole antenna and a microstrip (TEM) line are possible line elements that can be chosen. However, other line elements can be chosen as well. Multiple factors can be considered in determining which type of line element to choose. For example, desired SNR, SAR, and $B_1^+$ values for imaging a specific organ or tissue can be used to help determine which line element would be the most effective. Further, once the line element is selected, additional parameters can be selected including line element length and/or width, conductor length and/or width, the distance between the line elements and the tissue or organ to be imaged, type and thickness of substrate material used, etc.

At process block 1804, the loop element can be designed. Multiple design considerations can be taken into account when designing the loop element. For example, desired SNR, SAR, and $B_1^+$ values for imaging a specific organ or tissue can be used to determine the most effective loop-element design parameters. Example design parameters can include number of loop elements, loop dimensions, conductor width, and/or distance of elements from the tissue to be imaged.

At process block 1806, performance metrics of both the designed line and loop elements can be evaluated. This can include SNR, SAR, and $B_1^+$ parameters. In some configurations the SNR, SAR, and $B_1^+$ parameters can be evaluated based on the organ or tissue to be imaged. At process block 1808, the line and loop elements can be optimized based on the evaluated performance metrics. In some configurations, numerical simulations can be used to determine the optimized line and loop element parameters.

At process block 1810, the line and loop elements can be combined into line-loop elements, such as those discussed above. Relative geometrical placement of line and loop elements can be a design consideration used when combining the line and loop elements. In some configurations, the line and loop elements are combined such that they align along a central axis (i.e. longitudinal axis) of each element to ensure efficient and effective decoupling between the line element and the loop element. Finally, at process block 1812, the line-loop elements can be combined into a line-loop array. Multiple design considerations can be evaluated when designing the line-loop array. For example, desired SNR, SAR, and $B_1^+$ values can be considered. Additionally, distance between line-loop elements can be considered. The distance between line-loop elements can be a factor in determining coupling between neighboring line-loop elements. Further, design constraints such as the available number of transmit/receive channels, and/or available transmit power can be considered when designing the line-loop array. Finally, practical considerations such as coil housing size, can be factored in as well.

The present invention has been described in terms of one or more preferred embodiments, and it should be appreciated that many equivalents, alternatives, variations, additions, and modifications, aside from those expressly stated, and apart from combining the different features of the foregoing versions in varying ways, can be made and are within the scope of the invention. Moreover, the above list of exemplary uses for the disclosed technology is not meant to be exhaustive.

It is noted that, the devices implementing exemplary methods and systems may be involved in producing images, but are not so limited. In various configurations, any data may be obtained from the system in lieu of (or in combination with) images; these include, for example, functional data, spectroscopic data, various imaging data, etc. It is also noted that potential subjects (about which data is being acquired, whether that data is functional data, spectroscopic data, imaging data, etc.) can include any object(s), such as in vivo animal/human subjects, in vitro phantoms/samples, etc.

What is claimed is:

1. A hybrid antenna array for use in acquiring data using an MRI device, the antenna array comprising:
   one or more loop-line structures, each loop-line structure comprising a loop element and a line element which together form a hybrid transceiver block, wherein the loop element and the line element are aligned along their respective center axes, and wherein an input coil port includes at least one of a matching capacitor or an inductor for at least one of the elements of the block.

2. The hybrid antenna array of claim 1, wherein the line element is a dipole antenna.

3. The hybrid antenna array of claim 2, wherein the dipole antenna is a fractionated dipole antenna.

4. The hybrid antenna array of claim 1, wherein the line element is a microstrip line (TEM) element.

5. The hybrid antenna array of claim 1, further comprising a balun connected to the coil input port, wherein the balun comprises an inductor.

6. The hybrid antenna array of claim 1, wherein the loop element comprises a plurality of tuning capacitors connected to each other in series.

7. The hybrid antenna array of claim 1, wherein each loop-line structure comprises a plurality of loop elements associated with a line element,
wherein each of the plurality of loop elements is aligned along its respective center axis with a center axis of the line element.

8. The hybrid antenna array of claim 1, wherein the hybrid antenna array is configured to operate in a transceiver mode.

9. The hybrid antenna array of claim 1, wherein the hybrid antenna array is configured to operate in one of a transmit-only mode and a receive-only mode.

10. The hybrid antenna array of claim 1, wherein each loop element is placed symmetrically about the respective line element to substantially decouple loop elements from respective line elements.

11. The hybrid antenna array of claim 1, wherein the hybrid antenna array is a body imaging array with at least eight loop-line structures and at least 16 channels.

12. The hybrid antenna array of claim 1, wherein the hybrid antenna array is configured to acquire at least one of functional data, spectroscopic data, and imaging data.

13. The hybrid antenna array of claim 1, wherein at least one of a phase or an amplitude of an excitation signal is varied within the block between the loop element and the line element.

14. The hybrid antenna array of claim 1, wherein the one or more loop-line structures comprises a first loop-line structure and a second loop-line structure, and
wherein at least one of a phase or an amplitude of an excitation signal is varied between the first loop-line structure and the second loop-line structure.

15. The hybrid antenna array of claim 1, wherein the one or more loop-line structures comprises a plurality of loop-line structures, and
wherein each of the plurality of loop-line structures is configured to operate independently of the other of the plurality of loop-line structures.

16. A hybrid antenna array for use in acquiring data using an MRI device, the hybrid antenna array comprising:
a loop-coil element, the loop-coil element having a plurality of tuning capacitors; and
a dipole antenna element,
wherein the loop-coil element and the dipole antenna element combine to form a hybrid transceiver block,
wherein the loop-coil element and the dipole antenna element are aligned along their respective center axes, and
wherein at least one of the loop-coil element and the dipole antenna element further includes at least one of a matching capacitor or an inductor.

17. The hybrid antenna array of claim 16, wherein the dipole antenna element is a fractionated dipole antenna.

18. The hybrid antenna array of claim 16, wherein the matching capacitors are independently configured to provide a matching input impedance for the loop-coil element and the dipole antenna element.

19. The hybrid antenna array of claim 16, wherein the loop-coil element comprises a rectangular loop symmetrically-placed with respect to the dipole antenna element.

20. The hybrid antenna array of claim 16, wherein at least one of a phase or an amplitude of an excitation signal is varied between the loop-coil element and the dipole antenna element.

21. The hybrid antenna array of claim 16, further comprising a second loop-coil element and a second dipole antenna element,
wherein the second loop-coil element and the second dipole antenna element combine to form a second hybrid transceiver block, and
wherein at least one of a phase or an amplitude of an excitation signal is varied between the hybrid transceiver block and the second hybrid transceiver block.

22. A method of using a hybrid antenna array, the method comprising the step of:
using the hybrid antenna array in an MRI device to acquire at least one of functional data, spectroscopic data, and imaging data, the hybrid antenna array comprising:
one or more loop-line structures, each loop-line structure comprising a loop element and a line element which together form a hybrid transceiver block,
wherein the loop element and the line element are aligned along their respective center axes, and
wherein at least one of the loop element and the line element further includes at least one of a matching capacitor or an inductor.

23. The method of claim 22, wherein the hybrid antenna array is a body imaging array with at least eight loop-line structures and at least 16 channels.

24. The method of claim 22, further comprising varying at least one of a phase or an amplitude of an excitation signal between the loop element and the line element.

25. The method of claim 22, wherein the plurality of loop-line structures comprises a first loop-line structures and a second loop-line structures, and
wherein at least one of a phase or an amplitude of an excitation signal is varied between the first loop-line structures and the second loop-line structures.

26. The method of claim 22, wherein each loop-line structures comprises a plurality of loop elements associated with a line element,
wherein each of the plurality of loop elements is aligned along its respective center axis with a center axis of the line element.

* * * * *

UNITED STATES PATENT AND TRADEMARK OFFICE
CERTIFICATE OF CORRECTION

PATENT NO.        : 10,483,645 B2
APPLICATION NO.   : 15/415241
DATED             : November 19, 2019
INVENTOR(S)       : Mehmet Arcan Erturk et al.

Page 1 of 1

It is certified that error appears in the above-identified patent and that said Letters Patent is hereby corrected as shown below:

In the Specification

Column 11, Line 3, "(1 mm" should be --(≤1mm--.

Column 11, Line 52, " $\left( SNR \sim \dfrac{\sum_{n=1}^{16} |B_{1,n}^-|}{\sqrt{P_{coil}}} \right)$ " should be -- $\left( SNR \sim \dfrac{\sum_{n=1}^{16} |B_{1,n}^-|}{\sqrt{P_{coil}}} \right)$ --.

Signed and Sealed this
Seventh Day of January, 2020

Andrei Iancu
*Director of the United States Patent and Trademark Office*